United States Patent
Hosoi et al.

(10) Patent No.: US 8,115,586 B2
(45) Date of Patent: Feb. 14, 2012

(54) VARIABLE RESISTANCE ELEMENT, AND ITS MANUFACTURING METHOD

(75) Inventors: Yasunari Hosoi, Fukuyama (JP); Kazuya Ishihara, Kurashiki (JP); Takahiro Shibuya, Fukuyama (JP); Tetsuya Ohnishi, Ikoma-gun (JP); Takashi Nakano, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 683 days.

(21) Appl. No.: 12/298,089

(22) PCT Filed: Feb. 16, 2007

(86) PCT No.: PCT/JP2007/052833
§ 371 (c)(1), (2), (4) Date: Oct. 22, 2008

(87) PCT Pub. No.: WO2007/125668
PCT Pub. Date: Nov. 8, 2007

(65) Prior Publication Data
US 2009/0096568 A1  Apr. 16, 2009

(30) Foreign Application Priority Data
Apr. 28, 2006  (JP) ................... 2006-125766

(51) Int. Cl.
*H01C 7/10* (2006.01)
*H01C 7/13* (2006.01)
(52) U.S. Cl. .............. 338/20; 338/22 R; 257/4; 257/774
(58) Field of Classification Search .............. 338/20, 338/22 R; 333/4, 751; 257/4, 774
See application file for complete search history.

(56) References Cited

U.S. PATENT DOCUMENTS

| | | | |
|---|---|---|---|
| 6,204,139 B1 | 3/2001 | Liu et al. | |
| 6,538,272 B2 * | 3/2003 | Yamazaki et al. | 257/295 |
| 6,605,821 B1 * | 8/2003 | Lee et al. | 257/2 |

(Continued)

FOREIGN PATENT DOCUMENTS

JP    2002-537627    11/2002

(Continued)

OTHER PUBLICATIONS

International Search Report for PCT/JP2007/052833 mailed Apr. 10, 2007.

(Continued)

*Primary Examiner* — Kyung Lee
(74) *Attorney, Agent, or Firm* — Nixon & Vanderhye P.C.

(57) ABSTRACT

Provided are a variable resistive element having a configuration that the area of an electrically contributing region in a variable resistor body is smaller than the area defined by an upper electrode or a lower electrode, and a method for manufacturing the variable resistive element. The cross section of a current path, in which an electric current flows through between the two electrodes via the variable resistor body at the time of applying the voltage pulse to between the two electrodes, is formed with a line width of narrower than that of any of the two electrodes and of smaller than a minimum work dimension regarding manufacturing processes, so that its area can be made smaller than that of the electrically contributing region in the variable resistive element of the prior art.

17 Claims, 31 Drawing Sheets

U.S. PATENT DOCUMENTS

| | | | |
|---|---|---|---|
| 2004/0245557 A1* | 12/2004 | Seo et al. | 257/298 |
| 2005/0093043 A1 | 5/2005 | Morita et al. | |
| 2006/0011902 A1* | 1/2006 | Song et al. | 257/4 |
| 2006/0125108 A1* | 6/2006 | Gutsche et al. | 257/774 |
| 2006/0154432 A1 | 7/2006 | Arai et al. | |
| 2007/0096074 A1* | 5/2007 | Asano et al. | 257/4 |
| 2008/0157053 A1* | 7/2008 | Lai et al. | 257/4 |

FOREIGN PATENT DOCUMENTS

| | | |
|---|---|---|
| JP | 2004-241535 | 8/2004 |
| WO | 00/49659 | 8/2000 |
| WO | 2004/027877 | 4/2004 |
| WO | 2004/100266 | 11/2004 |

OTHER PUBLICATIONS

S.Q. Liu et al. "Electic-Pulse-Induced Reversible Resistance Change Effect in Magnetoresistive Films", Applied Physics Letters, vol. 76, pp. 2749-2751 (2000).

H. Pagnia et al., "Bistable Switching in Electroformed Metal-Insulator-Metal Devices", Phys. Stat. Sol. (a), vol. 108, pp. 11-65 (1988).

I.G. Baek et al., "Highly Scalable Non-Volatile Resistive Memory Using Simple Binary Oxide Driven by Asymmetric Unipolar Voltage Pulses", IEDM 04, pp. 587-590 (2004).

Y.H.Ha et al., An Edge Contact Type Cell for Phase Change RAM Featuring Very Low Power Consumption, (2003).

* cited by examiner

Fig. 3A
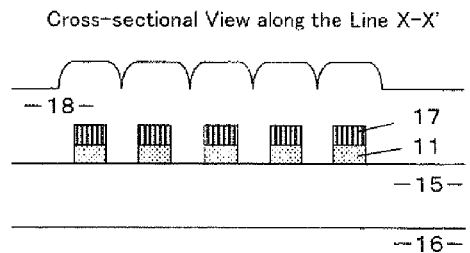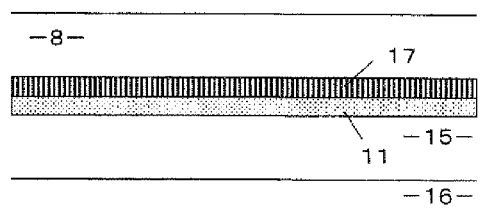
Fig. 3B
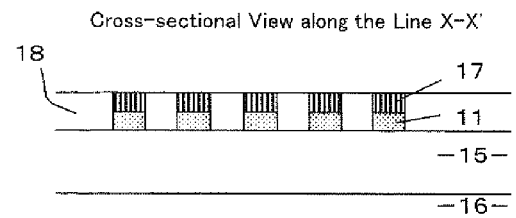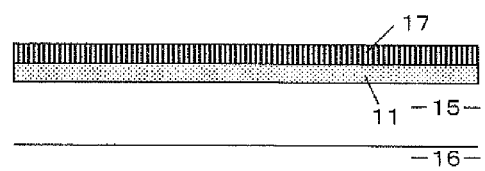
Fig. 3C
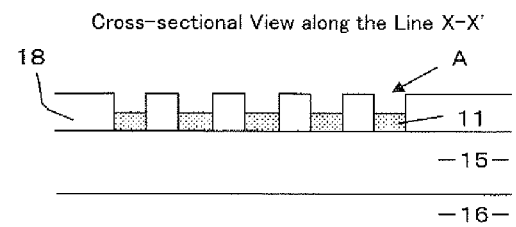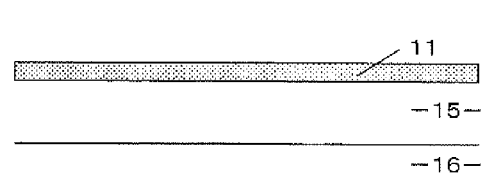
Fig. 3D
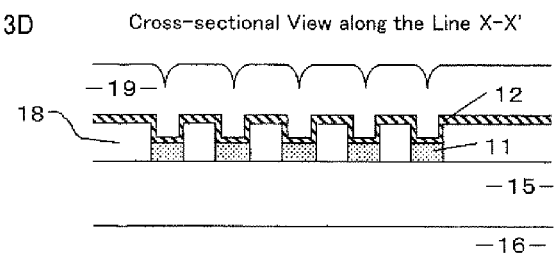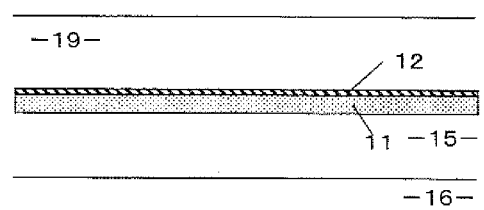

Fig. 4E  Cross-sectional View along the Line X-X'    Cross-sectional View along the Line Y-Y'
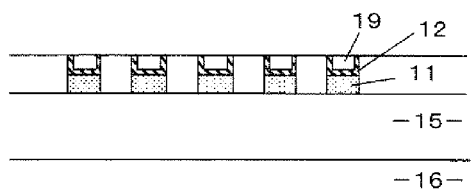
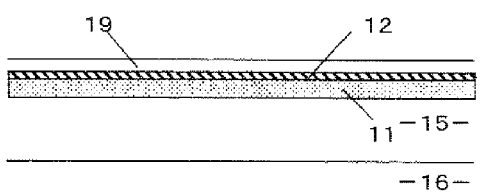
Fig. 4F  Cross-sectional View along the Line X-X'    Cross-sectional View along the Line Y-Y'
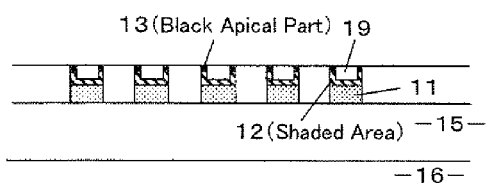
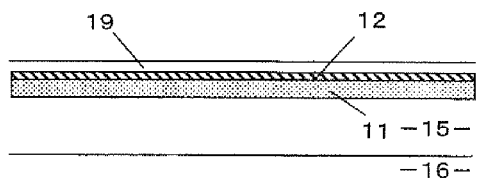
Fig. 4G  Cross-sectional View along the Line X-X'    Cross-sectional View along the Line Y-Y'
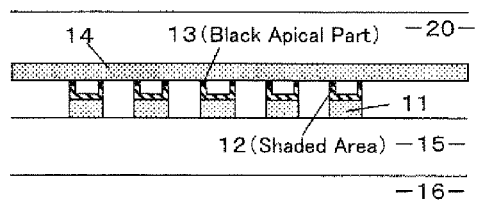
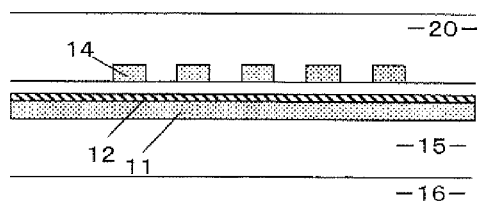

Fig. 7A    Cross-sectional View along the Line X-X'      Cross-sectional View along the Line Y-Y'
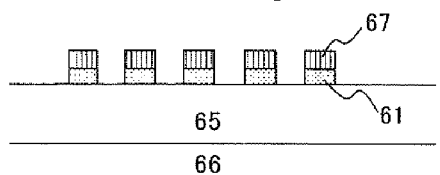 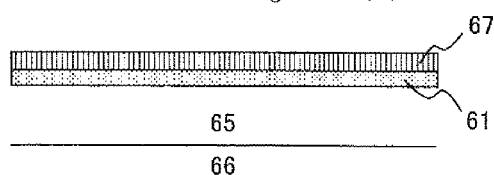
Fig. 7B    Cross-sectional View along the Line X-X'      Cross-sectional View along the Line Y-Y'
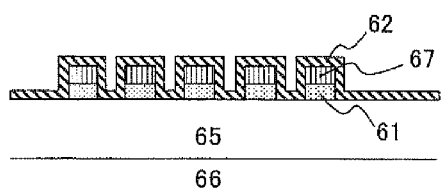 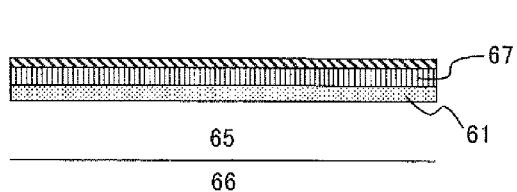
Fig. 7C    Cross-sectional View along the Line X-X'      Cross-sectional View along the Line Y-Y'
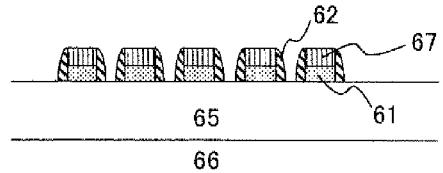 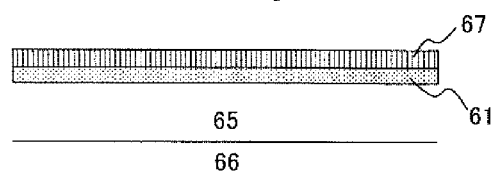
Fig. 7D    Cross-sectional View along the Line X-X'      Cross-sectional View along the Line Y-Y'
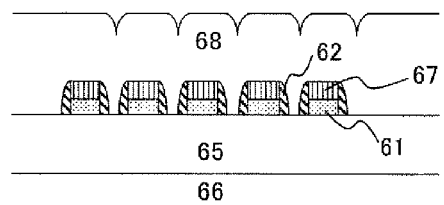 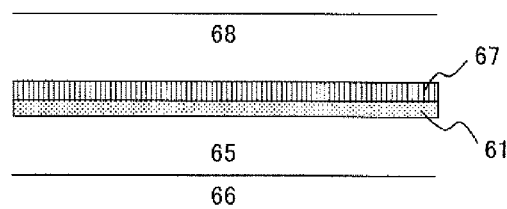

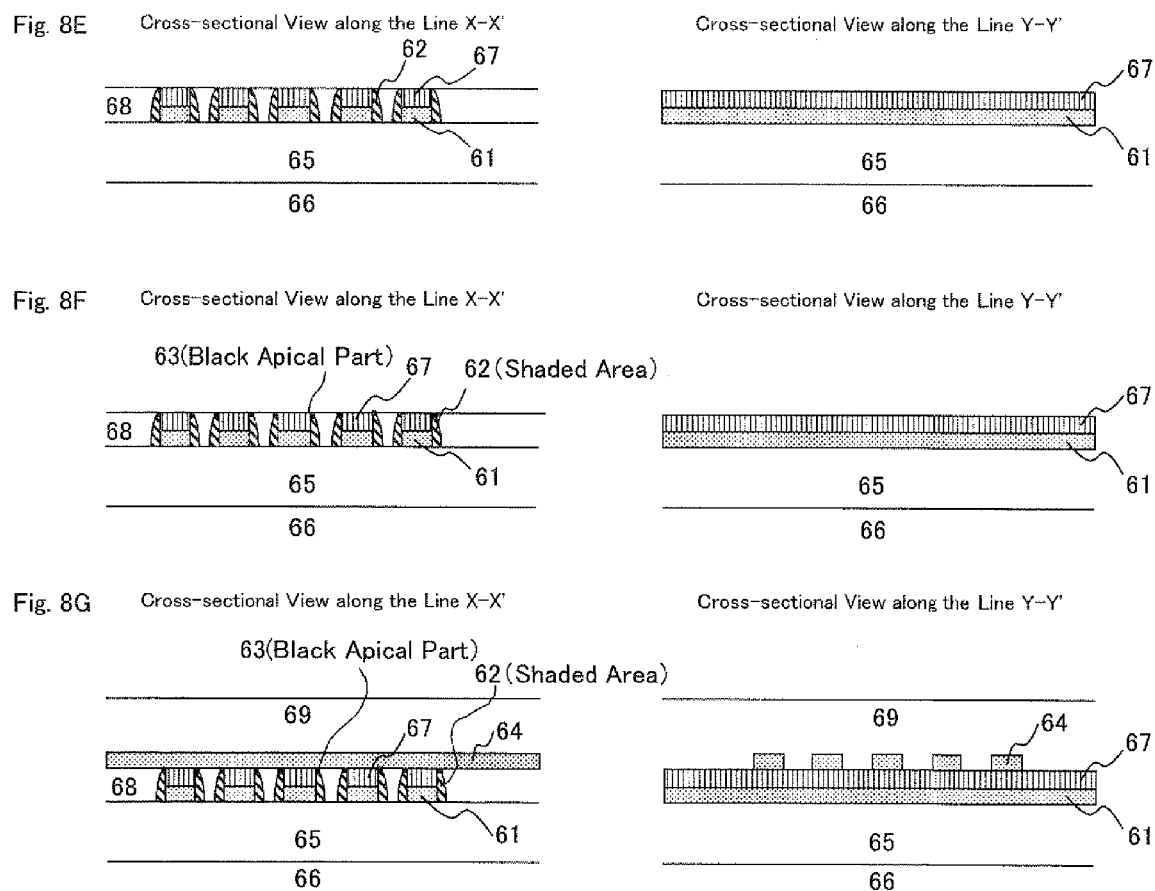

Fig. 11A  Cross-sectional View along the Line X-X'    Cross-sectional View along the Line Y-Y'
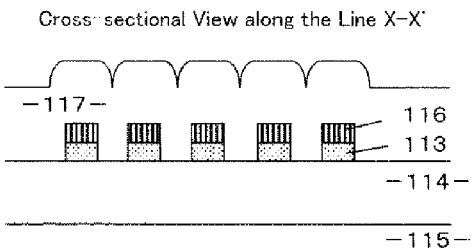
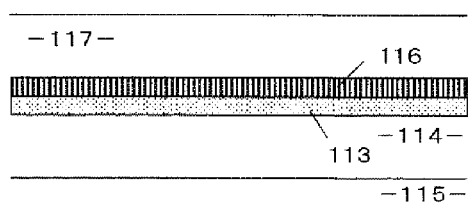
Fig. 11B  Cross-sectional View along the Line X-X'    Cross-sectional View along the Line Y-Y'
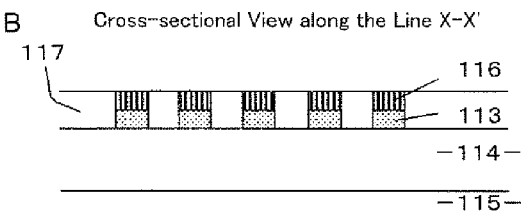
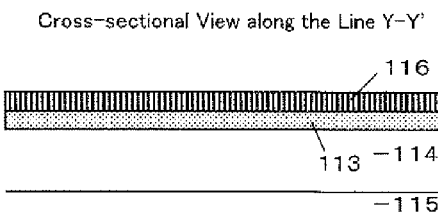
Fig. 11C  Cross-sectional View along the Line X-X'    Cross-sectional View along the Line Y-Y'
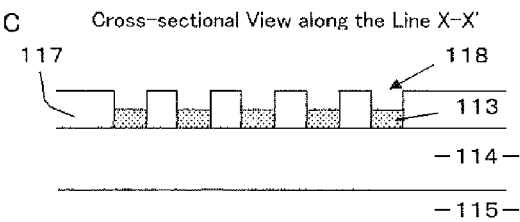
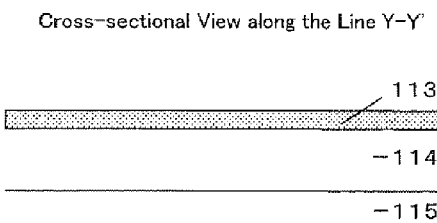
Fig. 11D  Cross-sectional View along the Line X-X'    Cross-sectional View along the Line Y-Y'
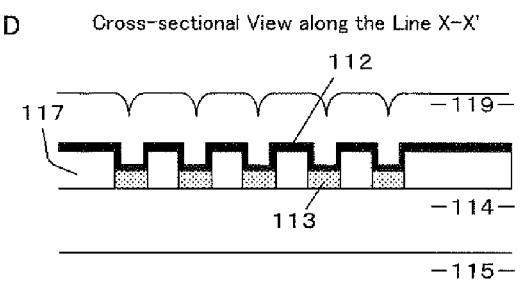
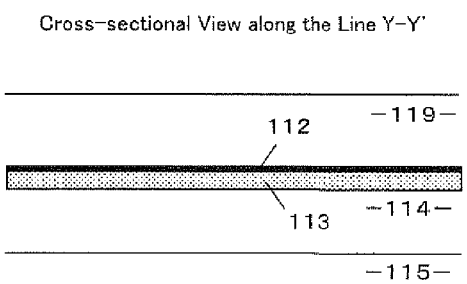

Fig. 12E  Cross-sectional View along the Line X-X'        Cross-sectional View along the Line Y-Y'
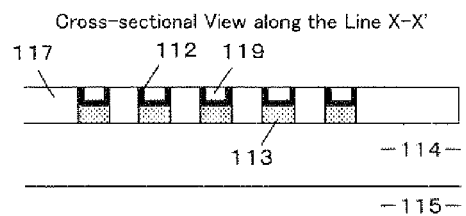 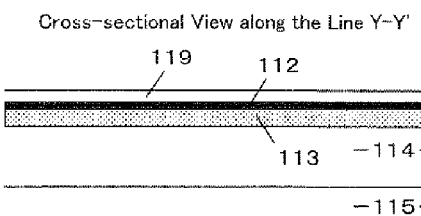
Fig. 12F  Cross-sectional View along the Line X-X'        Cross-sectional View along the Line Y-Y'
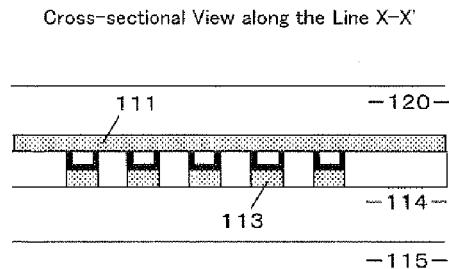 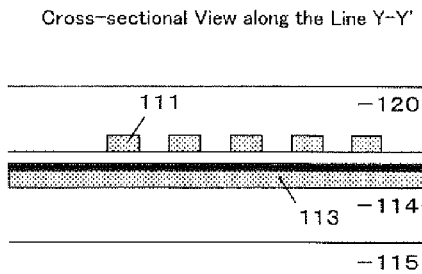

Fig. 15A    Cross-sectional View along the Line X-X'         Cross-sectional View along the Line Y-Y'
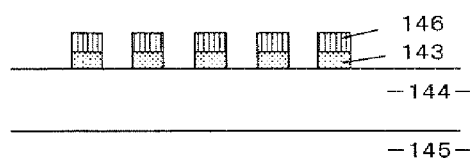 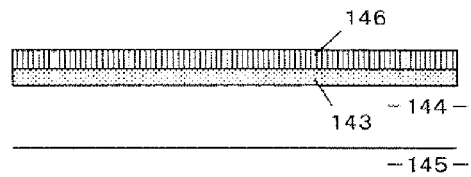
Fig. 15B    Cross-sectional View along the Line X-X'         Cross-sectional View along the Line Y-Y'
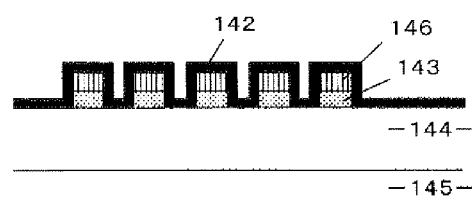 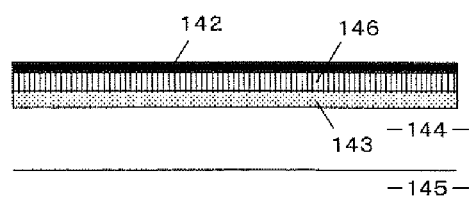
Fig. 15C    Cross-sectional View along the Line X-X'         Cross-sectional View along the Line Y-Y'
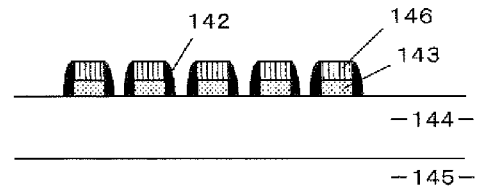 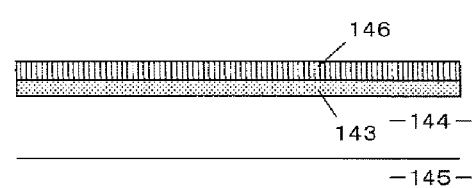
Fig. 15D    Cross-sectional View along the Line X-X'         Cross-sectional View along the Line Y-Y'
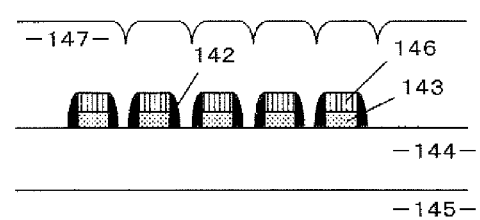 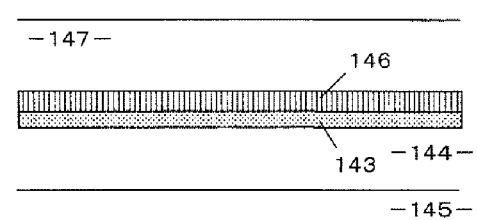

Fig. 16E  Cross-sectional View along the Line X-X'
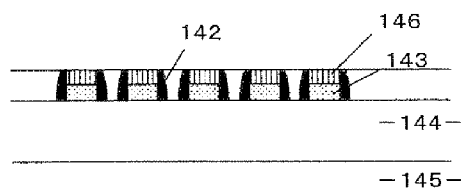
Cross-sectional View along the Line Y-Y'
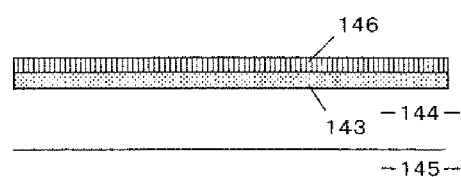
Fig. 16F  Cross-sectional View along the Line X-X'
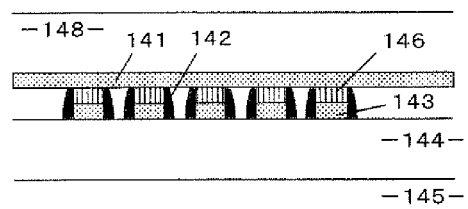
Cross-sectional View along the Line Y-Y'
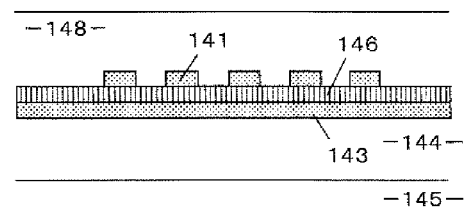

Fig. 21A   Cross-sectional View along the Line X-X'    Cross-sectional View along the Line Y-Y'
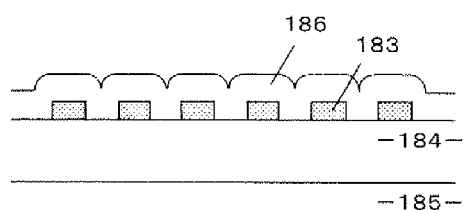 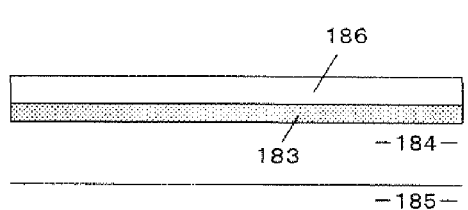
Fig. 21B   Cross-sectional View along the Line X-X'    Cross-sectional View along the Line Y-Y'
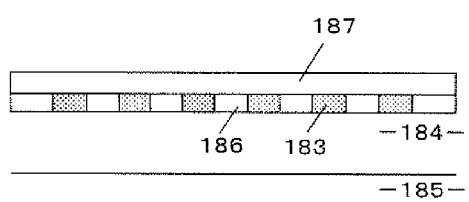 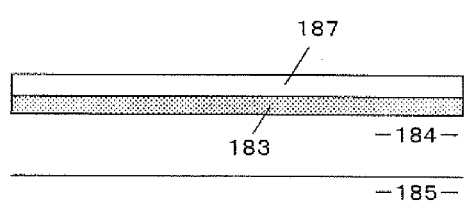
Fig. 21C   Cross-sectional View along the Line X-X'    Cross-sectional View along the Line Y-Y'
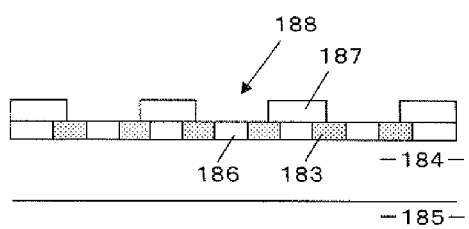 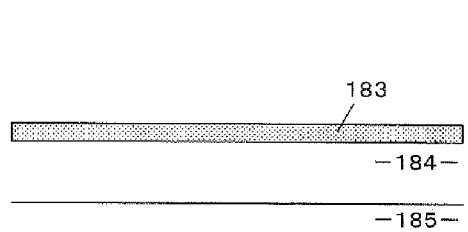
Fig. 21D   Cross-sectional View along the Line X-X'    Cross-sectional View along the Line Y-Y'
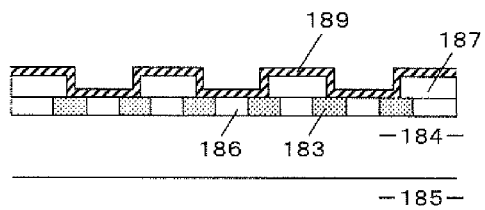 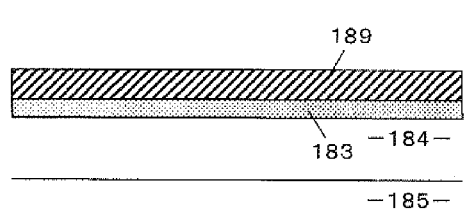

Fig. 22E  Cross-sectional View along the Line X-X'
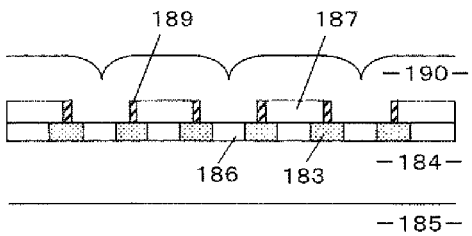
Cross-sectional View along the Line Y-Y'
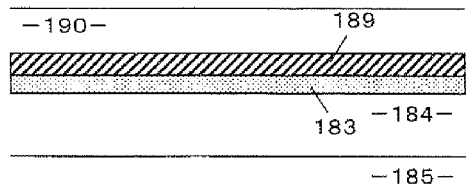
Fig. 22F  Cross-sectional View along the Line X-X'
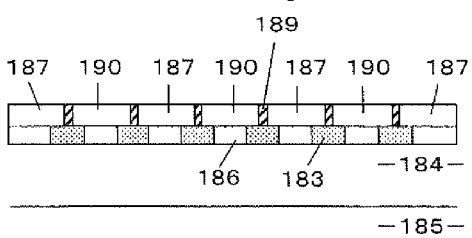
Cross-sectional View along the Line Y-Y'
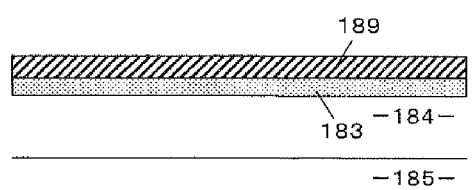
Fig. 22G  Cross-sectional View along the Line X-X'
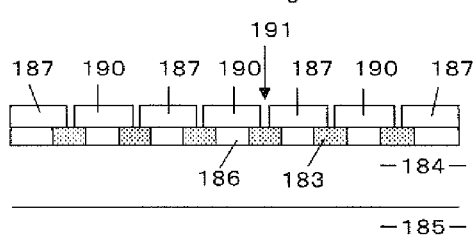
Cross-sectional View along the Line Y-Y'
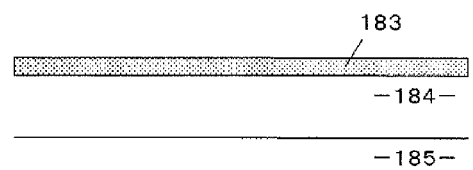
Fig. 22H  Cross-sectional View along the Line X-X'
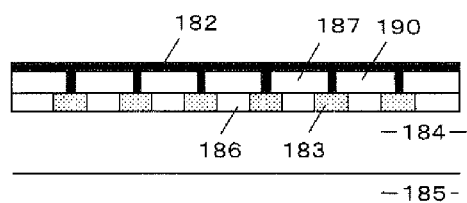
Cross-sectional View along the Line Y-Y'
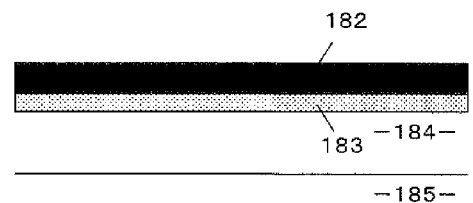

Fig. 23I    Cross-sectional View along the Line X-X'        Cross-sectional View along the Line Y-Y'
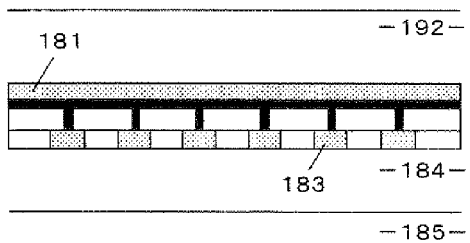
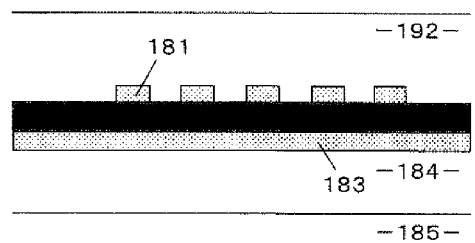

VARIABLE RESISTANCE ELEMENT, AND ITS MANUFACTURING METHOD

CROSS-REFERENCE TO RELATED APPLICATIONS

This application is a National Phase filing under 35 U.S.C. §371 of International Application No. PCT/JP2007/052833 filed on Feb. 16, 2007, and which claims priority to Japanese Patent Application No. 2006-125766 filed on Apr. 28, 2006.

TECHNICAL FIELD

The present invention relates to a variable resistive element comprising an electrode, another electrode and a variable resistor body, wherein the variable resistor body is provided between the one electrode and the other electrode, and an electrical resistance of the variable resistive element is changed by applying a voltage pulse to between both of the electrodes, and relates to it's manufacturing method.

BACKGROUND ART

In recent years, a variety of device structures are presented, such as a ferroelectric random access memory (FeRAM), a magnetic RAM (MRAM), a phase change RAM (PRAM), or the like, as a next generation nonvolatile RAM (NVRAM) for fast operation possible taking the place of a flash memory. And then a keen development race is performed from points of view of a higher performance, a higher reliability a lower cost and a higher integrity of manufacturing processes. However, each of such the current memory devices has both advantages and disadvantages respectively, and it is still a long way away from realizing an ideal universal memory having every advantage of a static RAM (SRAM), a dynamic RAM (DRAM) and the flash memory.

On the contrary to such the conventional technologies, there is presented a nonvolatile resistive random access memory (RRAM) using a variable resistive element wherein an electrical resistance of the variable resistive element is changed reversibly by applying a voltage pulse thereto. Here, a configuration of such the conventional variable resistive element is shown in FIG. 27.

Such the variable resistive element comprising the conventional configuration includes a structure that a lower electrode 203, a variable resistor body 202 and an upper electrode 201 are layered in order, and has a property that a resistance value is changed reversibly by applying the voltage pulse to between the upper electrode 201 and the lower electrode 203, as shown in FIG. 27. And then it comprises a configuration for being able to realize a novel nonvolatile semiconductor memory device by reading out the resistance value to be changed by such the operation of reversible changing in electrical resistance (referred to as a switching operation hereinafter).

Such the nonvolatile semiconductor memory device is comprised by forming a memory cell array with arranging each of a plurality of memory cells comprising a variable resistive element for each in a row direction and a column direction as a matrix form, and by arranging peripheral circuits to control programming, erasing and reading out operations for each of the memory cell in such the memory cell array. Moreover, for such the memory cell, there is provided such as a memory cell comprised of one selective transistor (T) and one variable resistive element (R) as it is called an 1T/1R type, a memory cell comprised of one variable resistive element (R) as it is called an 1R type, or the like, from a point of view of configuration element difference thereof. Here, a configuration example of the memory cell of 1T/1R type is shown in FIG. 28.

FIG. 28 is an equivalent circuit diagram showing one configuration example of a memory cell array using memory cells of 1T/1R type. In each of the memory cells, a gate electrode of the selective transistor (T) is connected to each of word lines WL1 to WLn respectively, and a source region of the selective transistor (T) is connected to each of source lines SL1 to SLn respectively, as (n) is a natural number. Moreover, one electrode of the variable resistive element (R) in each of the memory cells is connected to a drain region of the selective transistor (T) respectively, and another electrode of the variable resistive element (R) is connected to each of bit lines BL1 to BLm respectively, as (m) is a natural number.

Moreover, each of the word lines WL1 to WLn is connected to a word line decoder 206 respectively, each of the source lines SL1 to SLn is connected to a source line decoder 207 respectively, and each of the bit lines BL1 to BLm is connected to a bit line decoder 205 respectively. Furthermore, there is provided a configuration that a predetermined bit line, word line, or source line is to be selected corresponding to an address input (not shown) for a programming operation, an erasing operation, or a reading out operation respectively, regarding a predetermined memory cell in a memory cell array 204.

FIG. 29 is a cross sectional pattern diagram showing one memory cell comprising the memory cell array 204 as shown in FIG. 28. According to the present configuration, one memory cell is to be comprised of one selective transistor (T) and one variable resistive element (R). Moreover, the selective transistor (T) is comprised of a gate insulating layer 213, a gate electrode 214, a drain diffusion layer region 215 and a source diffusion layer region 216, and then it is formed on a top surface of a semiconductor substrate 211 where an element isolation region 212 is formed. Furthermore, the variable resistive element (R) is comprised of a lower electrode 218, a variable resistor body 219 and an upper electrode 220. According to the present embodiment, the variable resistor body 219 is arranged inside an open part arranged between the lower electrode 218 and the upper electrode 220, however, it may also available that such the elements are arranged in order from the top to be a terraced structure as shown in FIG. 27.

Moreover, the gate electrode 214 in the transistor (T) comprises a word line, and a source line wiring 224 is electrically connected to the source diffusion layer region 216 in the transistor (T) via a contact plug 222. Furthermore, a bit line wiring 223 is electrically connected to the upper electrode 220 in the variable resistive element (R) via a contact plug 221, meanwhile, the lower electrode 218 is electrically connected to the drain diffusion layer region 215 in the transistor (T) via a contact plug 217.

Thus, there is provided a configuration that the transistor becomes to be an on state in the selected memory cell using a change in electric potential of the word line, and it becomes able to program or erase selectively regarding the variable resistive element (R) in the selected memory cell using the change in electric potential of the bit line, by arranging the selective transistor (T) and the variable resistive element (R) as a series connection.

FIG. 30 is an equivalent circuit diagram showing one configuration example of a memory cell array using memory cells of 1R type. Each of the memory cells consists of one variable resistive element (R), wherein one electrode in each of the variable resistive elements (R) is connected to each of word lines WL1 to WLn respectively, and another electrode is connected to each of bit lines BL1 to BLm respectively. Moreover, each of the word lines WL1 to WLn is connected to a word line decoder 233 respectively, and each of the bit lines BL1 to BLm is connected to a bit line decoder 232 respectively. Furthermore, there is provided a configuration that a predetermined bit line or word line is to be selected corresponding to an address input (not shown) for a programming operation, an erasing operation, or a reading out operation respectively, regarding a predetermined memory cell in a memory cell array 231.

FIG. 31 is a diagrammatic perspective view schematically showing one example of a memory cell comprising the memory cell array 231 shown in FIG. 30. As shown in FIG. 31, an upper electrode wiring 243 and a lower electrode wiring 241 are arranged for crossing respectively, and then one of the electrode wirings forms a bit line, and the other forms a word line. Moreover, there is provided a configuration that a variable resistor body 242 is arranged in a region at the intersection of the electrode wirings as it is normally called a cross point. Here, the upper electrode wiring 243 and the resistor body 242 are manufactured in a similar shape according to the example shown in FIG. 31, however, a part electrically contributing to a switching operation in the variable resistor body 242 is to be the region as the cross point at the intersection of the upper electrode wiring 243 and the lower electrode wiring 241.

Regarding a variable resistor body material to be used for the above mentioned variable resistor body 219 shown in FIG. 29 or the variable resistor body 242 shown in FIG. 31, there is disclosed a technology in the following patent document 1 and a nonpatent document 1 by Shangquing Liu, Alex Ignatiev et al., University of Houston, USA, that an electrical resistance is changed reversibly by applying a voltage pulse to a perovskite material known for having a colossal magnetoresistance effect. Such the technology is extremely revolutionary as a change in electrical resistance appears in a wide range of several orders of magnitude even at room temperature without applying a magnetic field, even with using the perovskite material known for having the colossal magnetoresistance effect. Here, a crystalline praseodymium calcium manganese oxide (PCMO: $Pr_{1-x}Ca_xMnO_3$) layer as a perovskite-type oxide is used as the material for variable resistor body according to the element structure embodied in the patent document 1.

Moreover, according to a nonpatent document 2 and a patent document 2, it is known that an oxide of transition metal elements, such as a titanium oxide ($TiO_2$) layer, a nickel oxide (NiO) layer, a zinc oxide (ZnO) layer, a niobium oxide ($Nb_2O_5$) layer, or the like, shows a reversible change in electrical resistance as other materials for variable resistor body. Furthermore, there is reported in detail in a nonpatent document 3 regarding a phenomenon in a switching operation using the NiO layer among such the materials.

Patent document 1: U.S. Pat. No. 6,204,139
Nonpatent document 1: S. Q. Liu et al., "Electric-pulse-induced reversible Resistance change effect in magnetoresistive films", Applied Physics Letters, vol. 76, pp. 2749-2751 (2000)
Nonpatent document 2: H. Pagnia et al., "Bistable Switching in Electroformed Metal-Insulator-Metal Devices", Phys. Stat. Sol. (a), vol. 108, pp. 11-65 (1988)
Patent document 2: Japanese published patent publication 2002-537627
Nonpatent document 3: I. G. Baek et al., "Highly Scalable Non-volatile Resistive Memory using Simple Binary Oxide Driven by Asymmetric Unipolar Voltage Pulses", IEDM 04, pp. 587-590 (2004)

DISCLOSURE OF THE INVENTION

Problems to be Solved by the Invention

At the period of writing operation regarding data in the above mentioned nonvolatile memory device, that is to say, in the period from starting applying an electric pulse to between the upper electrode and the lower electrode to reaching a predetermined resistance value regarding the variable resistor body, a transient current flows through the variable resistive element (R). Such the current is called a programming current or an erasing current corresponding to a direction of change regarding the electrical resistance respectively. For example, in the case of using the oxide of transition metal element as the material for variable resistor body, there is reported in the nonpatent document 3 wherein the NiO layer is used that the programming current and the erasing current for an electrode surface area of $0.3 \times 0.7$ $\mu m^2$ are approximately 1 mA respectively. Both amounts of such the currents correspond to an area of an electrically contributing region in the variable resistor body, and then it is able to suppress the programming current and the erasing current by decreasing such the area, and it becomes able to suppress a current consumption in the nonvolatile memory device as well.

Moreover, it is able to manufacture a memory element reproducibly with a stable switching operation in the case of excellent crystalline for the variable resistor body generally, however, an improvement of such the crystalline cannot help but cause a relative decrease in a resistance value regarding the variable resistor body. Moreover, the resistance value regarding the variable resistor body is inversely proportional to an area of the electrically contributing region in the variable resistor body, and then the electrical resistance of the variable resistive element (R) becomes smaller in the case of such the area becoming larger. In such the case, regarding the memory cell of 1T/1R type, there is occurred a problem, such as a programming impossible or the like, because a sufficient voltage is not applied to the variable resistor body in the case of the electrical resistance of the variable resistive element (R) becoming considerably smaller than an on resistance of a control transistor (T). Furthermore, even for the memory cell of 1R type, a parasitic current flowing through any other cells except the selected cell becomes larger, that are connected to a selected bit wiring or word wiring, and then there is occurred the similar problem as the programming impossible due to an applying voltage becoming insufficient.

Therefore, it is able to suppress the current consumption and it becomes possible to manufacture the memory element reproducibly with a stable switching operation without becoming the programming impossible if it is able to manufacture in a smaller size regarding the area of the electrically contributing region in the variable resistor body. However, regarding the above mentioned conventional memory cell, the area of the electrically contributing region in the variable resistor body is specified, for example, by an area of the variable resistor body 219 part shown in FIG. 29 or by a size of the upper electrode 201 shown in FIG. 27 regarding the memory cell of 1T/1R type, and by an area of the cross point region at the intersection of the upper electrode wiring 243 and the lower electrode wiring 241 shown in FIG. 31 regarding the memory cell of 1R type. Hence, the area of the electrically contributing region in the variable resistor body is constrained by a minimum work dimension specified by manufacturing processes for such the electrodes and the like, such as the minimum dimension of formative fabrication line width or the minimum dimension of formative fabrication gap between lines determined by the manufacturing processes, such as a resolution capability regarding a photolithography, a work capability regarding an etching, or the like. And then the area to be able to realize has a lower limit against reducing thereof.

The present invention is presented with having regard to the above mentioned problems, and an object is to provide a variable resistive element comprising a configuration that an area of an electrically contributing region in a variable resistor body is finer than the minimum formative area constrained by the manufacturing processes, and to provide it's manufacturing method.

Means for Solving the Problem

For achieving the above mentioned object, a variable resistive element according to the present invention is characterized by comprising a variable resistor body provided between two electrodes, wherein an electrical resistance of between the two electrodes is changed by applying a voltage pulse to between the two electrodes, a cross-sectional shape of a current path, in which an electric current flows through between the two electrodes via the variable resistor body at the time of applying the voltage pulse to between the two electrodes, is formed with a line width of narrower than that of any of the two electrodes and the line width of the cross-sectional shape is smaller than a minimum work dimension regarding manufacturing processes.

The variable resistive element according to the present invention is characterized as second characteristics in addition to the first characteristics in that a region formed with the line width of narrower than that of any of the two electrodes and of smaller than the minimum work dimension regarding the manufacturing processes is at least one part of the variable resistor body.

According to the variable resistive element regarding the first and the second characteristics of the present invention, there is provided a configuration that an area of electrically contributing region in the variable resistor body becomes smaller without increasing a wiring resistance of any of the two electrodes. Thus, it becomes able to reduce a current consumption at the period of programming or erasing thereby, and it becomes able to manufacture a memory element reproducibly with a stable switching operation without becoming a programming impossible due to a low electrical resistance thereof.

The variable resistive element according to the present invention is characterized as third characteristics in addition to the second characteristics in that a planar shape of the region formed with the line width of narrower than that of any of the two electrodes and of smaller than the minimum work dimension regarding the manufacturing processes is annular or linear shape.

The variable resistive element according to the present invention is characterized as fourth characteristics in addition to the third characteristics by further comprising an open part to expose whole or a part of a top surface of a lower electrode as one of the two electrodes which is formed at a lower region, wherein the variable resistor body is formed along an inner sidewall of the open part or filling inside the open part.

The variable resistive element according to the present invention is characterized as fifth characteristics in addition to the third characteristics by further comprising an insulating layer on a lower electrode as one of the two electrodes which is formed at the lower region, wherein the variable resistor body is formed along an outer sidewall of the insulating layer.

According to the variable resistive element regarding the fourth and the fifth characteristics of the present invention, there is provided a configuration that it is able to manufacture the variable resistor body with the area of electrically contributing region in the variable resistor body smaller than a minimum formative area specified by manufacturing processes, by forming with a fine line width using a self-aligned process, except depending only on a fine processing which may be constrained by an exposure technology. Thus, it becomes able to reduce the current consumption at the period of programming or erasing thereby, and it becomes able to manufacture the memory element reproducibly with the stable switching operation without becoming the programming impossible due to the low electrical resistance thereof.

Moreover, for achieving the above mentioned object, a manufacturing method of the variable resistive element regarding the fourth characteristics according to the present invention is characterized as first characteristics by comprising a first step of forming a lower electrode as one of the two electrodes which is formed at a lower region by depositing any of electrode materials onto a substrate to be a first electrode layer, a second step of forming a first insulating layer on the lower electrode, the first insulating layer having an open part reaching a top surface of the lower electrode, a third step of forming the variable resistor body along an inner sidewall of the open part formed at the second step or filling the variable resistor body inside the open part, and a fourth step of forming an upper electrode as one of the two electrodes which is formed at an upper region by depositing any of electrode materials to be a second electrode layer.

According to the manufacturing method regarding the first characteristics, it is able to form the variable resistor body as a memory material body provided between the two electrodes with a line width of narrower than that of any of the two electrodes and of smaller than a minimum work dimension regarding the manufacturing processes. That is to say, a cross-sectional shape of a current path, in which an electric current flows through between the two electrodes via the variable resistor body, can be formed with a line width of narrower than that of any of the two electrodes and of smaller than the minimum work dimension regarding the manufacturing processes, so that it becomes able to manufacture the variable resistive element comprising the variable resistor body with being reduced an area of electrically contributing region therein.

The manufacturing method according to the present invention is characterized as second characteristics in addition to the first characteristics in that the third step includes the steps of depositing a material layer for variable resistor body onto the open part and the first insulating layer, depositing a second insulating layer onto the material layer for variable resistor body, removing the second insulating layer to expose a top surface of the material layer for variable resistor body, and forming the variable resistor body inside the open part by removing the material layer for variable resistor body layered on a region other than an upper region of the open part.

The manufacturing method according to the present invention is characterized as third characteristics in addition to the first characteristics in that the second stop includes a step of forming the first insulating layer having the open part reaching at least a part of the top surface of the lower electrode and comprised of a third insulating layer and a fourth insulating layer extending in a direction parallel to the lower electrode, being arranged alternately and continuously, and sandwiching the open part therebetween, the step includes the steps of depositing the third insulating layer on a plurality of lower electrodes, forming preliminary open parts inside the third insulating layer, the preliminary open parts crossing upper regions of any adjacent pair of the lower electrodes and passing completely through the third insulating layer for reaching at least a part of the top surface of each of the adjacent pair of the lower electrodes, depositing a dummy layer inside the preliminary open parts and on the third insulating layer using any of materials different from that for the third insulating layer, forming a dummy sidewall layer comprised of the dummy layer at sidewalls of the preliminary open parts by removing the dummy layer on the third insulating layer, depositing the fourth insulating layer on the dummy sidewall layer, flattening the fourth insulating layer to expose an apical part of the dummy sidewall layer, and forming the open part by removing the dummy sidewall layer.

The manufacturing method according to the present invention is characterized as fourth characteristics in addition to the first or the third characteristics in that the third step includes the steps of depositing a material layer for variable resistor body onto the open part and the first insulating layer, and forming the variable resistor body along an inner sidewall of the open part or filling the variable resistor body inside the open part by removing the material layer for variable resistor body layered on the first insulating layer.

Moreover, for achieving the above mentioned object, the manufacturing method of the variable resistive element regarding the fifth characteristics according to the present invention is characterized as fifth characteristics by further comprising a first step of forming the lower electrode as one of the two electrodes which is formed at a lower region by depositing a first electrode layer for constituting the lower electrode and a first insulating layer on a substrate and by processing the first electrode layer and the first insulating layer, a second step of forming the variable resistor body along an outer sidewall of the lower electrode and along an outer sidewall of the first insulating layer, and a third step of forming an upper electrode as one of the two electrodes which is formed at an upper region by depositing any of electrode materials to be a second electrode layer.

According to the manufacturing method regarding the fifth characteristics, it is able to form the variable resistor body as the memory material body provided between the two electrodes with the line width of narrower than that of any of the two electrodes and of smaller than the minimum work dimension regarding the manufacturing processes, as well as the manufacturing method according to the first characteristics. That is to say, it becomes able to manufacture the variable resistive element comprising the variable resistor body with being reduced the area of electrically contributing region therein.

The manufacturing method according to the present invention is characterized as sixth characteristics in addition to the fifth characteristics in that the second step includes the steps of depositing a material layer for variable resistor body on a whole surface including a top surface of the first insulating layer, forming the variable resistor body at an outer sidewall of the first electrode layer and at an outer sidewall of the first insulating layer by removing the material layer for variable resistor body formed at a region other than the outer sidewalls of the first electrode layer and the first insulating layer, depositing a second insulating layer on a whole surface including a top surface of the variable resistor body and of the first insulating layer, and flattening the second insulating layer to expose the top surface of the variable resistor body.

Furthermore, for achieving the above mentioned object, the manufacturing method according to the present invention is a method for manufacturing the variable resistive element regarding the second characteristics according to the present invention, the variable resistive element comprising the variable resistor body provided between the two electrodes, wherein the electrical resistance of between the two electrodes is changed by applying the voltage pulse to between the two electrodes, and the method is characterized as seventh characteristics by further comprising the steps of forming either one of the two electrodes, forming the variable resistor body so that the planar shape of at least a part of the variable resistor body is formed with a line width of smaller than the minimum work dimension regarding the manufacturing processes, and forming the other electrode of the two electrodes.

According to the manufacturing method regarding the seventh characteristics of the present invention, it is not required to reduce a wiring width of the upper electrode or of the lower electrode, and it is able to form the planar shape of at least the part of the variable resistor body with the line width of smaller than the minimum work dimension regarding the manufacturing processes. Thus, it becomes able to manufacture the variable resistive element comprising the variable resistor body with being reduced the area of electrically contributing region therein.

Effect of the Invention

In the variable resistive element of the present invention, the cross-sectional shape of the current path, in which the electric current flows through between the upper and the lower electrodes via the variable resistor body at the time of applying the voltage therebetween, that is the electrically contributing region in the variable resistor body is formed with the line width of narrower than that of any of the upper and the lower electrodes and of smaller than the minimum work dimension regarding the manufacturing processes. Therefore, it becomes able to reduce the current consumption at the period of programming or erasing thereby, and then it becomes able to manufacture the memory element reproducibly with the stable switching operation without becoming the programming impossible due to the low electrical resistance thereof.

BRIEF DESCRIPTION OF DRAWINGS

FIG. 3 is a brief cross sectional view showing a variable resistive element according to the first embodiment of the present invention in order of manufacturing process.

FIG. 4 is a brief cross sectional view showing the variable resistive element according to the first embodiment of the present invention in order of manufacturing process.

FIG. 7 is a brief cross sectional view showing a variable resistive element according to the second embodiment of the present invention in order of manufacturing process.

FIG. 8 is a brief cross sectional view showing the variable resistive element according to the second embodiment of the present invention in order of manufacturing process.

FIG. 11 is a brief cross sectional view showing a variable resistive element according to the third embodiment of the present invention in order of manufacturing process.

FIG. 12 is a brief cross sectional view showing the variable resistive element according to the third embodiment of the present invention in order of manufacturing process.

FIG. 15 is a brief cross sectional view showing a variable resistive element according to the fourth embodiment of the present invention in order of manufacturing process.

FIG. 16 is a brief cross sectional view showing the variable resistive element according to the fourth embodiment of the present invention in order of manufacturing process.

FIG. 21 is a brief cross sectional view showing a variable resistive element according to the sixth embodiment of the present invention in order of manufacturing process.

FIG. 22 is a brief cross sectional view showing the variable resistive element according to the sixth embodiment of the present invention in order of manufacturing process.

FIG. 23 is a brief cross sectional view showing the variable resistive element according to the sixth embodiment of the present invention in order of manufacturing process.

EXPLANATION OF REFERENCES

Figure 1:
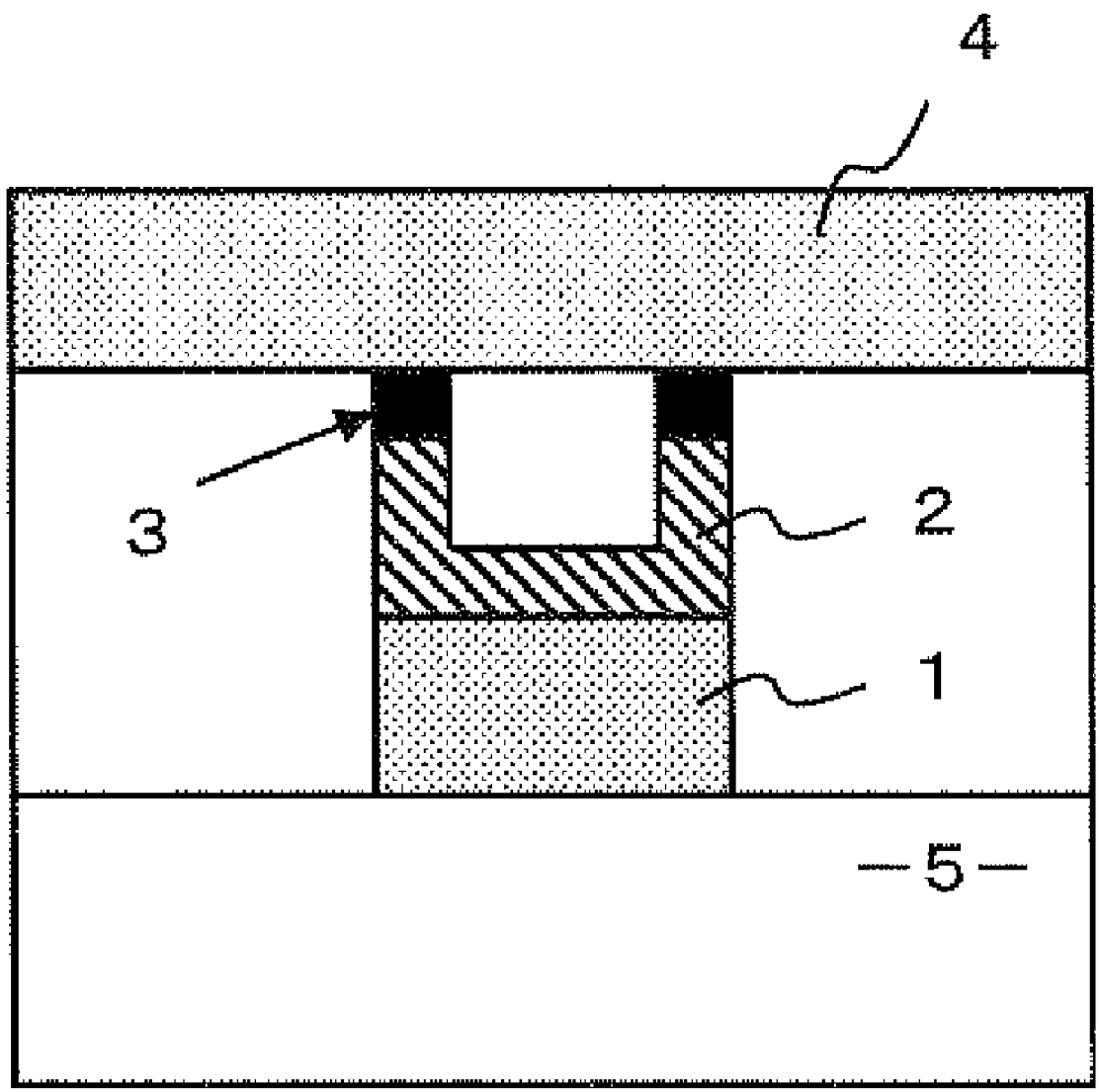
FIG. 1 is a brief cross sectional view showing a configuration of a variable resistive element according to the first embodiment of the present invention.

R: Variable Resistive Element
T: Selective Transistor
TE, 4, 14, 54, 64, 92, 94, 97, 101, 105, 111, 122, 124, 126, 131, 141, 164, 171, 175, 181, 193, 197, 201, 220, 243: Upper Electrode
BE, 1, 11, 51, 61, 91, 93, 96, 103, 107, 113, 121, 123, 125, 133, 143, 159, 173, 177, 183, 195, 199, 203, 218, 241: Lower Electrode
2, 12, 52, 62: Bump Electrode Material
3, 13, 53, 63, 102, 106, 112, 132, 142, 162, 172, 176, 182, 194, 198, 202, 219, 242: Variable Resistor Body
A, 95, 118, 161, 188, 191: Open Part
5, 55, 104, 108, 134, 174, 178, 185, 196, 200, 244: Base Substrate
16, 66, 115, 145, 151, 211: Semiconductor Substrate
15, 65, 114, 144, 157, 184: Base Insulating Layer
17, 67, 116, 146, 190: SiN Layer
18, 19, 68, 117, 119, 147, 160, 163, 186, 189: $SiO_2$ Layer
187: $Al_2O_3$ Layer
20, 69, 120, 148, 165, 192: Interlayer Insulating Layer
WBE: Open Part Pattern
152, 212: Element Isolation Region
153, 213: Gate Insulating Layer
154, 214: Gate Electrode
155, 215: Drain Region
156, 216: Source Region
158, 166, 167, 217, 221, 222: Contact Plug
168, 223: Bit Wiring
169, 224: Source Wiring
127: Open Part or Electrode Size
S1, S2, S3, S4, S5, S6, S7, S8: Cross section of the current path in which the electric current flows via the variable resistor body or of the electrically contributing region in the variable resistor body
204, 231: Memory Cell Array
205, 232: Bit Line Decoder
206, 233: Word Line Decoder
207: Source Line Decoder
BL1, BL2, . . . , BLm: Bit Line
WL1, WL2, . . . , WLn: Word Line
SL1, SL2, . . . , SLn: Source Line

BEST MODE FOR CARRYING OUT THE INVENTION

Preferred embodiments will be described in detail below with reference to the drawings regarding a variable resistive element (referred to as the present invention element hereinafter) and it's manufacturing method (referred to as the present invention method hereinafter) according to the present invention.

The present invention element comprises a configuration that there is provided a variable resistor body between two electrodes as an upper electrode and a lower electrode, wherein the configuration is that a cross-sectional shape of a current path, in which a current flows through between two of the electrodes via the variable resistor body, is formed with a line width of narrower than that of any of the two electrodes and the line width of such the cross-sectional shape is formed as smaller than a work dimension regarding manufacturing processes, and then it becomes able to control the current path with a small cross section in which the current flows via the variable resistor body. The following description is to be focused in particular regarding manufacturing processes of the variable resistor body, wherein the cross-sectional shape of such the current path is to be reduced comparing to that of conventional configurations.

The First Embodiment

The first embodiment according to the present invention element and the present invention method (properly referred to as the present embodiment hereinafter) will be described in detail below with reference to FIG. 1 to FIG. 5.

FIG. 1 is a brief cross sectional view showing the present invention element according to the present embodiment. The present invention element according to the present embodiment comprises a configuration that a lower electrode wiring 1 and an upper electrode wiring 4 are formed on a base substrate 5, and a variable resistor body 3 as a memory material body is formed between the upper and the lower electrode wirings, wherein a bump electrode material 2 comprised of any of electrically conductive materials is electrically connected to the lower electrode wiring 1, and the variable resistor body 3 is formed on an apical part of the bump electrode material 2, as shown in FIG. 1.

Figure 2:
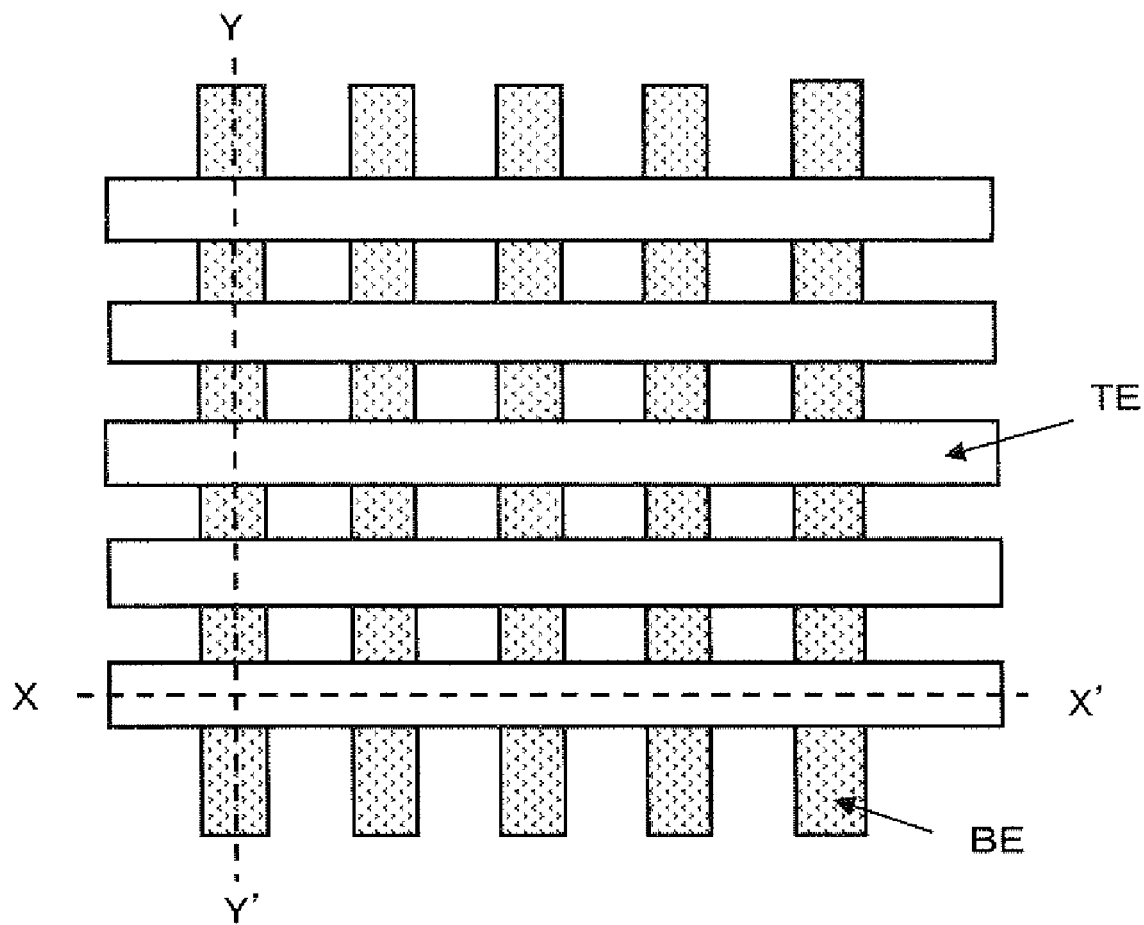
FIG. 2 is a plane pattern diagram showing a memory cell array of an 1R configuration.

The following is a description as an example for the case of applying the present invention element comprised of such the configuration to a memory cell of 1R type. FIG. 2 is a plane pattern diagram showing a memory cell array of an 1R configuration. Moreover, FIG. 3 and FIG. 4 are views showing manufacturing processes for the present invention element according to the present embodiment, as shown by FIG. 3A to FIG. 4G in order of each manufacturing process (Those are separated into two views for convenience sake due to page space). In FIG. 3 and FIG. 4, a cross sectional pattern diagram along an X-X' dashed line in FIG. 2, that is to say, along the upper electrode wiring TE, and the cross sectional pattern diagram along an Y-Y' dashed line therein, that is to say, along the lower electrode wiring BE are shown at the left side and the right side respectively therein.

Manufacturing processes for the present invention element according to the present embodiment will be described in detail below with reference to FIG. 3 and FIG. 4.

First, a base insulating layer 15 is to be formed on a semiconductor substrate 16 that peripheral circuits and the like (not shown) are properly formed on. According to the present embodiment, after depositing the base insulating layer 15 of borophosphosilicate glass (BPSG) with a thickness of 1500 nm, a surface of such the layer is flattened by polishing the surface of the BPSG layer 15 on a top surface of the semiconductor substrate 16 to be the thickness of 800 nm using a so-called chemical mechanical polishing (CMP) method. Next, a material layer 11 to be a lower electrode wiring is to be deposited thereon. According to the present embodiment, a Ti layer of 5 nm thickness, a TIN layer of 20 nm thickness, an Al—Cu layer of 200 nm thickness, another Ti layer of 5 nm thickness, and another TiN layer of 100 nm thickness are to be deposited in order using a spattering method respectively, as a multilayer structure of TiN/Ti/Al—Cu/TiN/Ti. Moreover, an SiN layer 17 is to be deposited with the thickness of 150 nm on the material layer 11 to be the lower electrode wiring using a chemical vapor deposition (CVD) method. Next, the lower electrode wiring is to be formed by etching the SiN layer 17 and the material layer 11 to be the lower electrode wiring using a photolithography method with a resist as a mask (not shown) patterned as a line and space (L/S) shape shown as the lower electrode wiring BE in FIG. 2. And then as shown in FIG. 3A, an SiO$_2$ layer 18 is to be deposited with the thickness of 600 nm using the CVD method thereunto.

Next, the SiO$_2$ layer 18 is to be flattened and a top surface of the SiN layer 17 is to be exposed by polishing the SiO$_2$ layer 18 to the top surface level of the SiN layer 17 using the CMP method, as shown in FIG. 3B. Here, the flattening method is not limited to the CMP method, as it may be also available to use any proper flattening technology including such as a spin-on method, the spin-on method combined with an etch back method, or the like.

Next, an open part A is to be formed by removing the SiN layer 17 selectively for the SiO$_2$ layer 18 and for the material layer 11 to be the lower electrode wiring, using a dry etching method with an NF$_3$ plasma of downstream type, as shown in FIG. 3C. Here, the removing method for the SiN layer 17 is not limited to the dry etching method, as it may be removed using a wet etching method with a heated phosphor treatment as well.

Next, a TiN layer 12 as one example of the material layer to be a bump electrode material is to be deposited with the thickness of 40 nm using the spattering method over the surface thereof, as shown in FIG. 3D. In this case, it is able to form the TiN layer 12 along an inner sidewall in the open part A with the thickness of 20 nm for example. Moreover, an SiO$_2$ layer 19 is to be deposited over the surface with the thickness of 600 nm using the CVD method thereafter. Here, the TiN layer 12 is formed along the open part A, so that the inside of the open part A may be not to be filled therewith.

Next, the SiO$_2$ layer 19 is to be flattened and a top surface of the TiN layer 12 is to be exposed by polishing the SiO$_2$ layer 19 using the CMP method to the top surface level of the TiN layer 12. And then the bump electrode material 12 is to be formed by removing the TiN layer 12 on the SiO$_2$ layer 18 except that inside the open part A using the etch back method thereafter, as shown in FIG. 4E.

Next, a TiO$_2$ layer 13 is to be formed by thermal oxidizing in an atmosphere including oxygen at a temperature of between 250 and 450° C. as one example of the variable resistor body formed by oxidizing an exposed apical part of the bump electrode material 12 comprised of the TiN layer, as shown in FIG. 4F. According to the present embodiment, the variable resistor body is to be the TiO$_2$ layer, however, it is also possible to form a TiO$_{2-x}$N$_x$ layer having a characteristic of variable electrical resistance by controlling properly an oxidation condition, such as an oxidation temperature, an oxygen concentration, or the like.

Next, a material layer 14 to be an upper electrode wiring is to be formed over the surface thereof. According to the present embodiment, a TiN layer of 20 nm thickness, an Al—Cu layer of 200 nm thickness, a Ti layer of 5 nm thickness, and another TiN layer of 100 nm thickness are to be deposited in order using the spattering method respectively, as a multilayer structure of TiN/Ti/Al—Cu/TiN. Next, the upper electrode wiring 14 is to be formed by etching the material layer 14 to be the upper electrode wiring, using the photolithography method with the resist as the mask (not shown) patterned as the line and space (L/S) shape shown as the upper electrode wiring TE in FIG. 2. Moreover, an interlayer insulating layer 20 is to be deposited thereunto, and then a contact wiring (not shown) and a metal wiring (not shown) are to be formed for the upper electrode wiring 14 and the lower electrode wiring 11 respectively, as shown in FIG. 4G.

Regarding such the variable resistive element formed thereby, it becomes able to reduce an area of a contact surface between the variable resistor body and any of the electrodes comparing to that of the conventional configurations. The following is a detailed description in this regard with reference to the drawings.

Figure 5A:
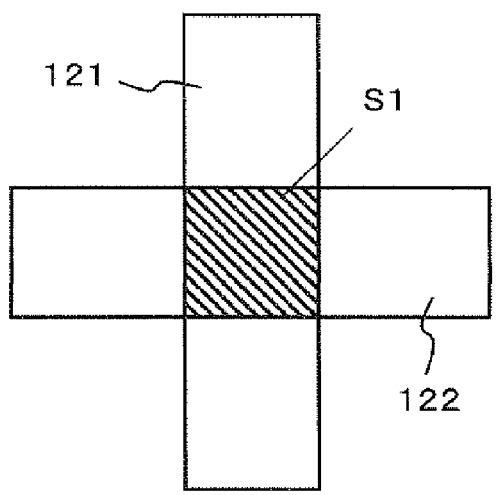
FIG. 5 is a plane pattern diagram showing electrically contributing regions in variable resistor bodies according to a conventional configuration and the first embodiment of the present invention, respectively.
Figure 5B:
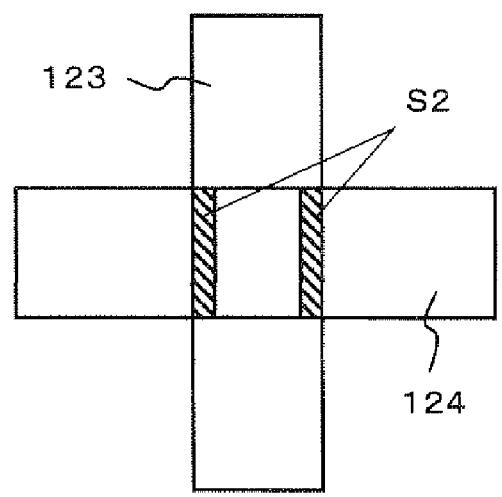

FIG. 5 is a plane pattern diagram of the variable resistive element according to the present embodiment comparing to a variable resistive element of a conventional configuration. FIG. 5A shows the one of the conventional configuration, and FIG. 5B shows regarding the configuration according to the present embodiment.

Regarding the conventional memory cell of 1R type, a cross point region as a region S1 (a shaded area in the figure) at an intersection of an lower electrode wiring 121 and an upper electrode wiring 122 is the electrically contributing region in the variable resistor body, as shown in FIG. 5A.

On the contrary, according to the variable resistive element regarding the present embodiment, there is provided the configuration that the bump electrode material is to be formed only in a partial region at an interface side on a lower electrode wiring 123 and to be electrically connected to an upper electrode wiring. And then the cross point region as a region S2 (a shaded area in the figure) at the intersection of such the bump electrode material and the upper electrode wiring 124 is to be the electrically contributing region in the variable resistor body.

The region S2 has a band shape with a width of at least the layer thickness of the bump electrode material, and it is able to reduce the area comparing to the region S1 regarding the conventional variable resistive element. Moreover, it is able to form the bump electrode material using a self-aligned process, and then it is able to change arbitrarily such the area by controlling the layer thickness thereof.

That is to say, it is able to reduce a contact area according to the configuration regarding the present embodiment comparing to the contact area of the conventional configuration. Thus, it becomes able to reduce a current consumption, and it becomes possible to manufacture a memory element reproducibly with a stable switching operation without becoming a programming impossible, by configuring a nonvolatile memory device using such the variable resistive element.

Here, the deposited insulating layers are to be the $SiO_2$ layer 18 and the $SiO_2$ layer 19 in the above description, however, the insulating layer is not limited to such the $SiO_2$ layer; it may be also available to use any of proper insulating layers including such as an SiN layer, a polyimide layer, an SiOF layer, or the like. Moreover, regarding the deposition of the insulating layers, it may be deposited using any proper deposition technology including such as a pulsed laser deposition, an rf spattering, an electron beam evaporation, a thermal evaporation, an organo-metal deposition, a spin-on deposition, a metalorganic chemical vapor deposition, or the like. Ditto regarding each of the following embodiments.

The Second Embodiment

The second embodiment according to the present invention element and the present invention method (properly referred to as the present embodiment hereinafter) will be described in detail below with reference to FIG. 6 to FIG. 9. Here, a detailed description for a process overlapping that of the first embodiment is properly omitted with mentioning that effect.

Figure 6:
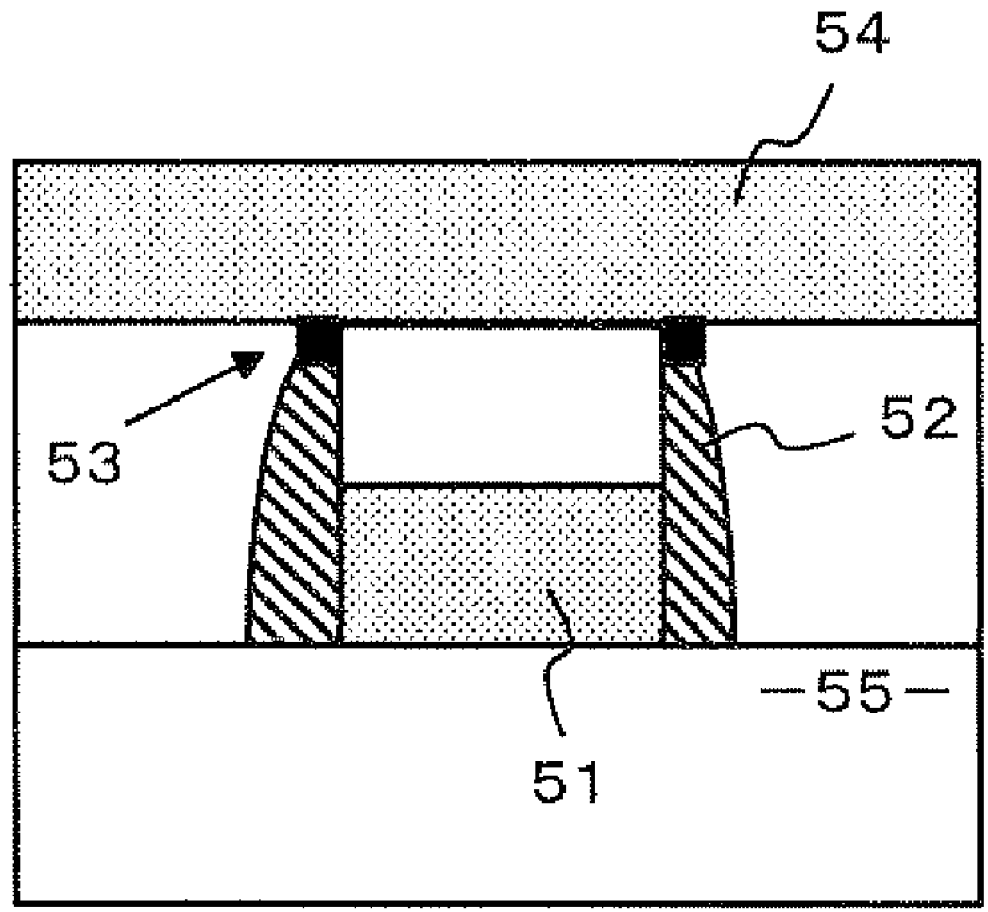
FIG. 6 is a brief cross sectional view showing a configuration of a variable resistive element according to the second embodiment of the present invention.

FIG. 6 is a brief cross sectional view showing the present invention element according to the present embodiment. The present invention element according to the present embodiment comprises a configuration that a lower electrode wiring 51 and an upper electrode wiring 54 are formed on a base substrate 55, and a variable resistor body 53 as a memory material body is formed between the upper and the lower electrodes, wherein a bump electrode material 52 comprised of any of electrically conductive materials is electrically connected to the lower electrode wiring 51, and the bump electrode material 52 is electrically connected to the upper electrode wiring 54 via the variable resistor body 53, as shown in FIG. 6.

Next, the manufacturing method for the present invention element according to the present embodiment will be described in detail below, as an example for the case of applying to a memory cell of 1R type as shown in FIG. 2. FIG. 7 and FIG. 8 are views showing manufacturing processes for the present invention element according to the present embodiment, as shown by FIG. 7A to FIG. 8G in order of each manufacturing process (Those are separated into two views for convenience sake due to page space). In FIG. 7 and FIG. 8, a cross sectional pattern diagram along the X-X' dashed line, that is to say, along the upper electrode wiring TE in FIG. 2 for showing the memory cell array of the 1R configuration, and a cross sectional pattern diagram along the Y-Y' dashed line therein, that is to say, along the lower electrode wiring BE are shown at the left side and the right side respectively therein.

First, a base insulating layer 65 is to be formed on a semiconductor substrate 66 that peripheral circuits and the like (not shown) are properly formed. According to the present embodiment as well as the first embodiment, after depositing the base insulating layer of BPSG 65 with the thickness of 1500 nm, the surface of the layer is flattened by polishing the surface of the BPSG layer 65 using the CMP method to be the thickness of 800 nm on the top surface of the semiconductor substrate 66. Next, a material layer 61 to be a lower electrode wiring is to be deposited thereon. According to the present embodiment, the Ti layer of 5 nm thickness, the TiN layer of 20 nm thickness, the Al—Cu layer of 200 nm thickness, the other Ti layer of 5 nm thickness, and the other TiN layer of 100 nm thickness are to be deposited in order using the spattering method respectively, as the multilayer structure of TiN/Ti/Al—Cu/TiN/Ti. Moreover, an SiN layer 67 is to be deposited using the CVD method with the thickness of 150 nm on the material layer 61 to be the lower electrode wiring. Next, the lower electrode wiring is to be formed as shown in FIG. 7A, by etching the SiN layer 67 using the photolithography method with the resist as the mask (not shown) patterned as the line and space (L/S) shape shown as the lower electrode wiring BE in FIG. 2, by removing the resist thereafter, and by etching the material layer 61 to be the lower electrode wiring using such the patterned SiN layer 67 as the other mask thereafter.

Next, a TiN layer 62 as one example of the material layer to be the bump electrode material is to be deposited using the spattering method with the thickness of 40 nm over the surface thereof, as shown in FIG. 7B. In this case, it is able to form the TiN layer 62 along a sidewall of the lower electrode wiring 61 with the thickness of approximately 20 nm for example.

Next, a process using the etch back method is to be performed for the TiN layer 62 to be removed completely from both top surfaces of the base insulating layer 65 and of the SiN layer 67. Hence, the TiN layer 62 is to be remained along the sidewalls of the lower electrode wiring 61 and of the SiN layer 67 by performing such the process, as shown in FIG. 7C.

Next, an $SiO_2$ layer 68 is to be deposited using the CVD method with the thickness of 600 nm over the surface thereof, as shown in FIG. 7D.

Next, the $SiO_2$ layer 68 is to be flattened and a part of the TiN layer 62 is to be exposed by polishing the $SiO_2$ layer 68 using the CMP method to the top surface level of the TiN layer 62, as shown in FIG. 8E. Here, the flattening method is not limited to the CMP method; it may be also available to use any proper flattening technology including such as the spin-on method, the spin-on method combined with the etch back method, or the like.

Next, a $TiO_2$ layer 63 as one example of the variable resistor body is to be formed by thermal oxidizing the top part of the exposed bump electrode material 62 comprised of the TiN layer in the atmosphere including oxygen at the temperature of between 250 and 450° C., as shown in FIG. 8F.

Next, a material layer 64 to be the upper electrode wiring is to be formed over the surface thereof. According to the present embodiment, the TiN layer of 20 nm thickness, the Al—Cu layer of 200 nm thickness, the Ti layer of 5 nm thickness, and the other TiN layer of 100 nm thickness are to be deposited in order using the spattering method respectively, as the multilayer structure of TiN/Ti/Al—Cu/TiN. Next, the upper electrode wiring 64 is to be formed by etching the material layer 64 to be the upper electrode wiring using the photolithography method with the resist as the mask (not shown) patterned as the line and space (L/S) shape shown as the upper electrode wiring TE in FIG. 2. Moreover, an interlayer insulating layer 69 is to be deposited thereunto, and then the contact (not shown) and the metal wiring (not shown) are to be formed for the upper electrode wiring 64 and the lower electrode wiring 61 respectively, as shown in FIG. 8G.

According to the configuration regarding the present embodiment, there is provided the configuration that the upper electrode wiring 54 is electrically connected to the bump electrode material 52 via the variable resistor body 53, and the bump electrode material 52 is electrically connected to the lower electrode wiring 51 at the sidewall thereof. Regarding such the variable resistive element formed thereby, it becomes able to reduce the area of the contact surface between the variable resistor body and any of the electrodes comparing to that of the conventional configurations, as well as the above mentioned first embodiment.

Figure 9A:
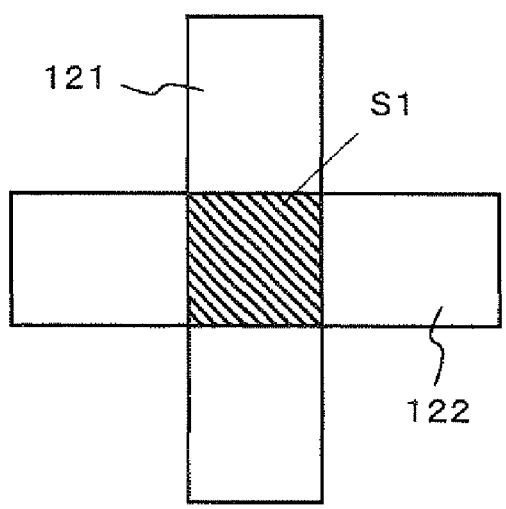
FIG. 9 is a plane pattern diagram showing electrically contributing regions in variable resistor bodies according to a conventional configuration and the second embodiment of the present invention, respectively.
Figure 9B:
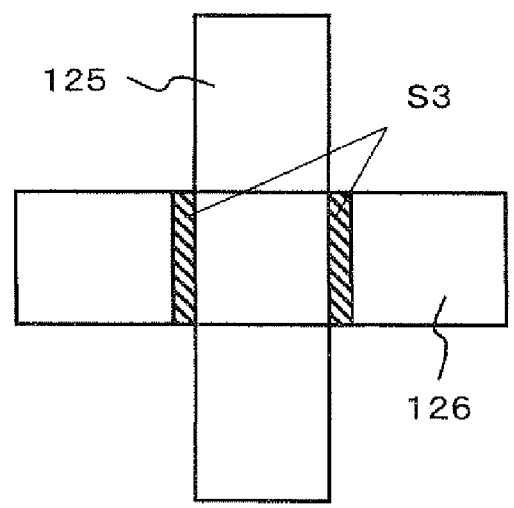

FIG. 9 is a plane pattern diagram of the variable resistive element according to the present embodiment comparing to a variable resistive element of a conventional configuration. FIG. 9A shows the one of the conventional configuration, and FIG. 9B shows regarding the configuration according to the present embodiment. Here, the configuration as shown in FIG. 9A is similar to that shown in FIG. 5A.

According to the variable resistive element regarding the present embodiment, there is provided the configuration that the bump electrode material is to be formed only at an outside region of the sidewall of a lower electrode wiring 125 and to be electrically connected to an upper electrode wiring 126. And then the cross point region as a region S3 (a shaded area in the figure) at the intersection of such the bump electrode material and the upper electrode wiring 126 becomes to be the electrically contributing region in the variable resistor body.

The region S3 has the band shape with the width of at least the layer thickness of the bump electrode material, however, it is able to reduce the area comparing to the region S1 regarding the conventional variable resistive element. Moreover, it is able to form the bump electrode material using the self-aligned process, and then it is able to change arbitrarily regarding such the area by controlling the layer thickness thereof.

That is to say, it is able to reduce the contact area according to the configuration regarding the present embodiment comparing to the contact area of the conventional configuration, as well as the configuration of the above mentioned first embodiment. Thus, it becomes able to reduce the current consumption, and it becomes possible to manufacture the memory element reproducibly with the stable switching operation without becoming the programming impossible, by configuring the nonvolatile memory device using such the variable resistive element.

Here, the variable resistor body is formed by oxidizing the exposed part of the bump electrode material 62 according to the present embodiment, however, it may also available to form the variable resistor body onto the top surface of the bump electrode material 62 by depositing a $TiO_2$ layer for example as the material layer for variable resistor body.

The Third Embodiment

The third embodiment according to the present invention element and the present invention method (properly referred to as the present embodiment hereinafter) will be described in detail below with reference to FIG. 10 to FIG. 13.

Figure 10A:
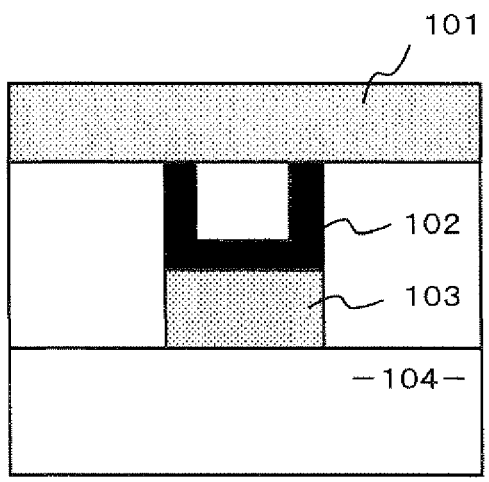
FIG. 10 is a brief cross sectional view showing a configuration of a variable resistive element according to the third embodiment of the present invention.

FIG. 10 is a brief cross sectional view showing the present invention element according to the present embodiment. The present invention element according to the present embodiment comprises a configuration that a lower electrode wiring 103 and an upper electrode wiring 101 are formed on a base substrate 104, and a variable resistor body 102 as the memory material body is formed between the upper and the lower electrode wirings, wherein the variable resistor body 102 electrically connected to the lower electrode wiring 103 is to be a bump shape at an upper region of both edge sides of the lower electrode wiring 103 as outstanding toward the upper electrode wiring 101, as shown in FIG. 10A. Hence, the cross-sectional shape at the contact surface between the variable resistor body 102 and the upper electrode wiring 101 is formed so as to be narrower than the line width of the lower electrode wiring 103, and then the current flowing through the variable resistor body 102 becomes to be controlled by using such the narrow cross section of the surface contacting to the upper electrode wiring 101. Thus, it becomes able to manufacture a desirable variable resistor body comprising a fine current path thereby.

Figure 10B:
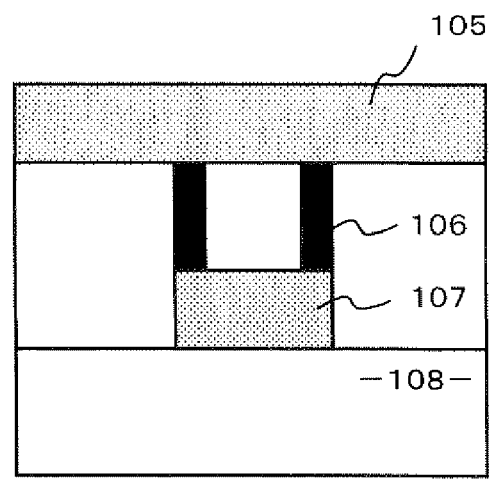

Moreover, the other present invention element according to the present embodiment comprises a configuration that a lower electrode wiring 107 and an upper electrode wiring 105 are formed on a base substrate 108, and a variable resistor body 106 as the memory material body is formed between the upper and the lower electrode wirings, wherein the variable resistor body 106 is to be formed only at the upper region of both edge sides of the lower electrode wiring 107, as shown in FIG. 10B. Hence, every cross-sectional shape is formed so as to be narrower than the line width of the lower electrode wiring 107 thereby, at each of the contact surfaces between the variable resistor body 106 and the upper electrode wiring 105, and between the variable resistor body 106 and the lower electrode wiring 107 respectively.

The following is a description as an example for the case of applying the present invention element comprised of such the configuration to a memory cell of 1R type, with using the variable resistive element shown in FIG. 10A. FIG. 11 and FIG. 12 are views showing manufacturing processes for the present invention element according to the present embodiment, as shown by FIG. 11A to FIG. 12F in order of each manufacturing process (Those are separated into two views for convenience' sake due to page space). In FIG. 11 and FIG. 12, a cross sectional pattern diagram along the X-X' dashed line in FIG. 2, that is to say, along the upper electrode wiring TE, and a cross sectional pattern diagram along the Y-Y' dashed line therein, that is to say, along the lower electrode wiring BE are shown at the left side and the right side respectively therein.

Manufacturing processes for the present invention element according to the present embodiment will be described in detail below with reference to FIG. 11 and FIG. 12.

First, a base insulating layer 114 is to be formed on a semiconductor substrate 115 that peripheral circuits and the like (not shown) are properly formed on. According to the present embodiment, after depositing the base insulating layer 114 of borophosphosilicate glass (BPSG) with the thickness of 1500 nm, the surface of the layer is to be flattened by polishing the surface of the BPSG layer 114 using the so-called chemical mechanical polishing (CMP) method to be the thickness of 800 nm on the top surface of the semiconductor substrate 115. Next, a material layer 113 to be the lower electrode wiring is to be deposited thereon. According to the present embodiment, the Ti layer of 5 nm thickness, the TiN layer of 20 nm thickness, the Al—Cu layer of 200 nm thickness, the other Ti layer of 5 nm thickness, and the other TiN layer of 100 nm thickness are to be deposited in order using the spattering method respectively as the multilayer structure of TiN/Ti/Al—Cu/TiN/Ti. Moreover, an SiN layer 116 is to be deposited using the chemical vapor deposition (CVD) method with the thickness of 150 nm on the material layer 113 to be the lower electrode wiring. Next, the lower electrode wiring is to be formed by etching the SiN layer 116 and the material layer 113 to be the lower electrode wiring using the photolithography method with the resist as the mask (not shown) patterned as the line and space (L/S) shape shown as the lower electrode wiring BE in FIG. 2. And then as shown in FIG. 11A, an $SiO_2$ layer 117 is to be deposited using the CVD method with the thickness of 600 nm thereunto.

Next, the $SiO_2$ layer 117 is to be flattened and the top surface of the SiN layer 116 is to be exposed by polishing the $SiO_2$ layer 117 using the CMP method to the top surface level of the SiN layer 116, as shown in FIG. 11B. Here, the flattening method is not limited to the CMP method; it may be also available to use any proper flattening technology including such as the spin-on method, the spin-on method combined with the etch back method, or the like.

Next, an open part 118 is to be formed by removing the SiN layer 116 selectively for the $SiO_2$ layer 117 and for the material layer 113 to be the lower electrode wiring, by using the dry etching method with the $NF_3$ plasma of downstream type, as shown in FIG. 11C. Here, the removing method for the SiN layer 116 is not limited to the dry etching method, and it may be removed by using the wet etching method with the heated phosphor treatment as well.

Next, a $TiO_2$ layer 112 as one example of the material layer for variable resistor body is to be deposited over the surface thereof. According to the present embodiment, the CVD method is used as one example for depositing the $TiO_2$ layer by reacting $TiCl_4$ with oxygen at a substrate temperature of between 350 and 400° C. And then it is able to form the $TiO_2$ layer 112 with the thickness of 25 nm deposited on the $SiO_2$ layer 117 and with the thickness of 20 nm formed along the inner sidewall of the open part 118 for example. Here, the $TiO_2$ layer 112 is formed along the open part 118, so that the inside of the open part 118 may be not to be filled therewith. Moreover, an $SiO_2$ layer 119 is to be deposited using the CVD method with the thickness of 600 nm over the surface thereof, as shown in FIG. 11D.

Next, the $SiO_2$ layer 119 is to be flattened and the top surface of the $TiO_2$ layer 112 is to be exposed by polishing the $SiO_2$ layer 119 using the CMP method to the top surface level of the $TiO_2$ layer 112. And then the variable resistor body 112 is to be formed by removing the $TiO_2$ layer 112 on the $SiO_2$ layer 117 except that inside the open part 118 using the etch back method thereafter, as shown in FIG. 12E, that is comprised of the $TiO_2$ layer and including the bump shape as outstanding upward at the upper region of both edge sides of the lower electrode wiring 113.

Next, a material layer 111 to be the upper electrode wiring is to be formed over the surface thereof. According to the present embodiment, the TiN layer of 20 nm thickness, the Al—Cu layer of 200 nm thickness, the Ti layer of 5 nm thickness, and the other TiN layer of 100 mm thickness are to be deposited in order using the spattering method respectively, as the multilayer structure of TiN/Ti/Al—Cu/TiN. Next, the upper electrode wiring 111 is to be formed by etching the material layer 111 to be the upper electrode wiring using the photolithography method with the resist as the mask (not shown) patterned as the line and space (L/S) shape shown as the upper electrode wiring TE in FIG. 2. Moreover, an interlayer insulating layer 120 is to be deposited thereunto, and then the contact (not shown) and the metal wiring (not shown) are to be formed for the upper electrode wiring 111 and the lower electrode wiring 113 respectively, as shown in FIG. 12F.

The above description regarding the manufacturing processes is embodied for an application of the variable resistive element shown in the FIG. 10A. Meanwhile, the variable resistive element shown in the FIG. 10B can be formed with the process shown in FIG. 111D including the steps of; depositing the $TiO_2$ layer 112 first over the surface thereof; performing a process using the etch back method to remove the $TiO_2$ layer 12 completely from the surface of the $SiO_2$ layer 117 for remaining the $TiO_2$ layer 112 only at the inner sidewall of the open part 18 as a so-called sidewall shape; and depositing the $SiO_2$ layer 119 using the CVD method over the surface thereof.

Regarding such the variable resistive element formed thereby, as shown in FIG. 10A and FIG. 10B, it becomes able to reduce the area of the contact surface between the variable resistor body and any of the electrodes comparing to that of the conventional configurations. The following is a detailed description in this regard with reference to the drawings.

Figure 13A:
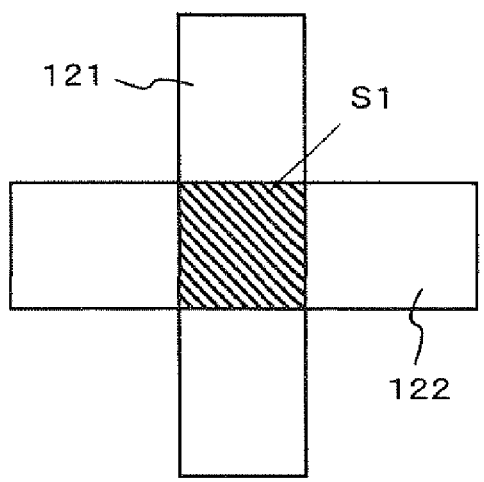
FIG. 13 is a plane pattern diagram showing electrically contributing regions in variable resistor bodies according to a conventional configuration and the third embodiment of the present invention, respectively.
Figure 13B:
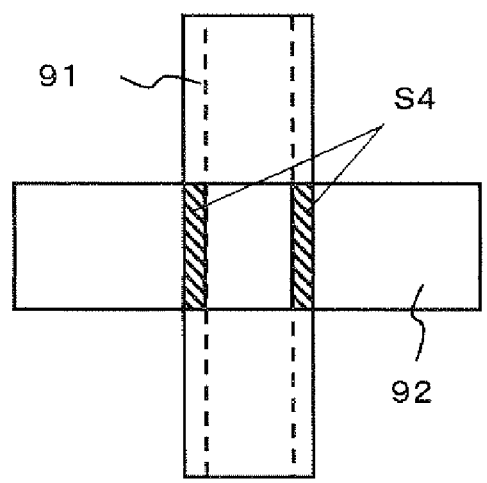

FIG. 13 is a plane pattern diagram of the variable resistive element according to the present embodiment comparing to a variable resistive element of a conventional configuration. FIG. 13A shows the one of the conventional configuration, and FIG. 13B shows regarding the configuration according to the present embodiment. Here, the configuration as shown in FIG. 13A is similar to that shown in FIG. 5A.

Regarding the conventional memory cell of 1R type, the cross point region as the region S1 (the shaded area in the figure) at the intersection of the lower electrode wiring 121 and the upper electrode wiring 122 is the electrically contributing region in the variable resistor body, as shown in FIG. 13A.

On the contrary, according to the variable resistive element regarding the present embodiment, there is provided the configuration that the variable resistor body is to be formed only in the partial region at the interface side on a lower electrode wiring 91 (two narrow band regions surrounded by dashed lines in the figure) and to be electrically connected to a lower electrode wiring. And then the cross point region as a region S4 (a shaded area in the figure) at the intersection of such the variable resistor body and the upper electrode wiring 92 shows the cross section region of the current path in which the current flows through between the upper and the lower electrodes via the variable resistor body, and it becomes to be the electrically contributing region in the variable resistor body.

The region S4 has the band shape with the width of at least the layer thickness of the variable resistor body formed on both edge side regions of the lower electrode wiring 91, and it is able to reduce the area comparing to the region S1 regarding the conventional variable resistive element. Moreover, it is able to form the variable resistor body using the self-aligned process, and then it is able to change arbitrarily regarding such the area by controlling the layer thickness thereof.

That is to say, it is able to reduce the contact area according to the configuration regarding the present embodiment comparing to the contact area of the conventional configuration. Thus, it becomes able to reduce the current consumption, and it becomes possible to manufacture the memory element reproducibly with the stable switching operation without becoming the programming impossible, by configuring the nonvolatile memory device using such the variable resistive element.

Here, a tip of the $TiO_2$ layer 112 as the variable resistor body is formed to be as approximately same as the level surface of the $SiO_2$ layer 117 regarding the process as shown in FIG. 12E according to the present embodiment. However, the present invention is not limited thereto, and it may also comprise a configuration that such the variable resistor body is formed with the thickness to be thinner by performing further etching for the $TiO_2$ layer 112 and by forming the tip of the $TiO_2$ layer 112 to be lower than the level surface of the $SiO_2$ layer 117, as an object of adjusting the thickness of the variable resistor body in the direction of facing between the upper and the lower electrode wiring. Ditto regarding such the configuration for that in FIG. 10B.

The Fourth Embodiment

The fourth embodiment according to the present invention element and the present invention method (properly referred to as the present embodiment hereinafter) will be described in detail below with reference to FIG. 14 to FIG. 17.

Figure 14:
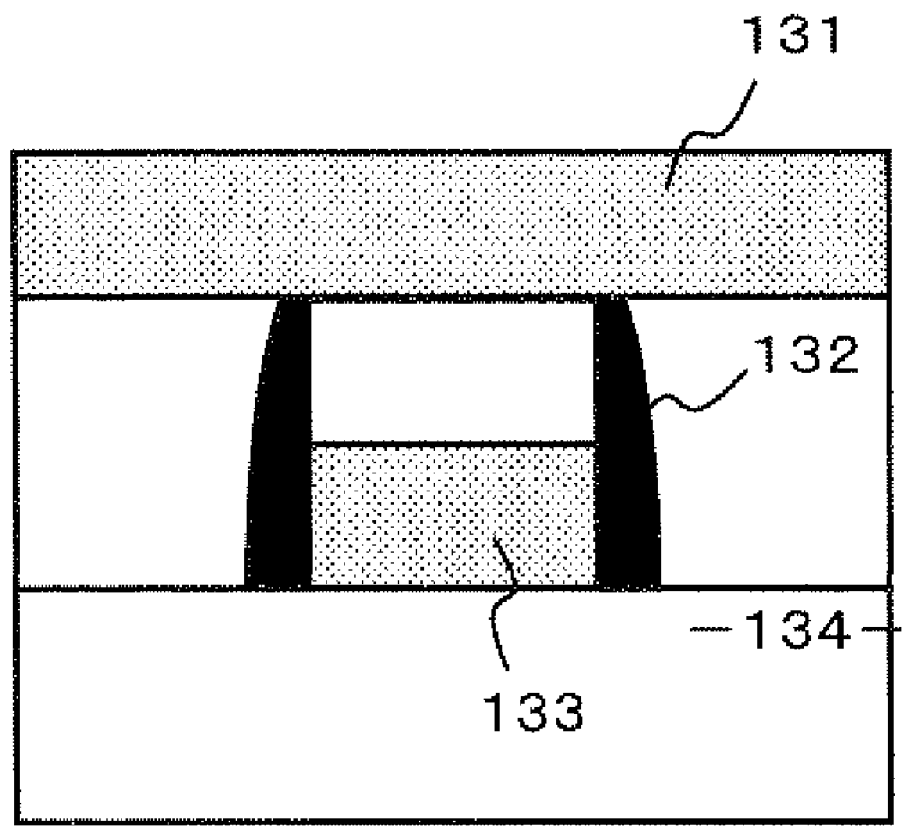
FIG. 14 is a brief cross sectional view showing a configuration of a variable resistive element according to the fourth embodiment of the present invention.

FIG. 14 is a brief cross sectional view showing the present invention element according to the present embodiment. The present invention element according to the present embodiment comprises a configuration that a lower electrode wiring 133 and an upper electrode wiring 131 are formed on a base substrate 134, and a variable resistor body 132 as the memory material body is formed between the upper and the lower electrodes, wherein the variable resistor body 132 electrically connected to the lower electrode wiring 133 is to be as outstanding shape toward the upper electrode wiring 131, as shown in FIG. 14. Hence, the cross-sectional shape at the contact surface between the variable resistor body 132 and the upper electrode wiring 131 is formed so as to be narrower than the line width of the lower electrode wiring 133 thereby.

The following is a description as an example for the case of applying the present invention element according to the present embodiment to a memory cell of 1R type as shown in FIG. 2. FIG. 15 and FIG. 16 are views showing manufacturing processes for the present invention element according to the present embodiment, as shown by FIG. 15A to FIG. 16F in order of each manufacturing process (Those are separated into two views for convenience' sake due to page space). In FIG. 15 and FIG. 16, a cross sectional pattern diagram along the X-X' dashed line, that is to say, along the upper electrode wiring TE in FIG. 2 showing the memory cell array of the 1R configuration, and a cross sectional pattern diagram along the Y-Y' dashed line therein, that is to say, along the lower electrode wiring BE are shown at the left side and the right side respectively therein.

First, a base insulating layer 144 is to be formed on a semiconductor substrate 145 that peripheral circuits and the like (not shown) are properly formed on. According to the present embodiment as well as the third embodiment, after depositing the base insulating layer of BPSG 144 with the thickness of 1500 nm, the surface of the layer is to be flattened by polishing the surface of the BPSG layer 144 using the CMP method to be the thickness of 800 nm on the top surface of the semiconductor substrate 145. Next, a material layer 143 to be a lower electrode wiring is to be deposited thereon. According to the present embodiment, the Ti layer of 5 nm thickness, the TiN layer of 20 nm thickness, the Al—Cu layer of 200 nm thickness, the other Ti layer of 5 nm thickness, and the other TiN layer of 100 nm thickness are to be deposited in order using the spattering method respectively, as the multilayer structure of TiN/Ti/Al—Cu/TiN/Ti. Moreover, an SiN layer 146 is to be deposited using the CVD method with the thickness of 150 nm on the material layer 143 to be the lower electrode wiring. Next, the lower electrode wiring is to be formed as shown in FIG. 15A, by etching the SiN layer 146 using the photolithography method with the resist as the mask (not shown) patterned as the line and space (L/S) shape shown as the lower electrode wiring BE in FIG. 2, by removing the resist thereafter, and by etching the material layer 143 to be the lower electrode wiring using the patterned SiN layer 146 as the other mask thereafter.

Next, a $TiO_2$ layer 142 as one example of a material layer to be the variable resistor body is to be deposited using the CVD method with the thickness of 25 nm over the surface thereof, as shown in FIG. 15B. In this case, it is able to form the $TiO_2$ layer 142 along a sidewall of the lower electrode wiring 143 with the thickness of approximately 20 nm for example.

Next, a process using the etch back method is to be performed for the $TiO_2$ layer 142 to be removed completely from both top surfaces of the base insulating layer 144 and of the SiN layer 146. Hence, the variable resistor body 142 comprised of the $TiO_2$ layer is to be remained as a bump shape along the sidewalls of the lower electrode wiring 143 and of the SiN layer 146 by such the process, as shown in FIG. 15C.

Next, an $SiO_2$ layer 147 is to be deposited using the CVD method with the thickness of 600 nm over the surface thereof, as shown in FIG. 15D.

Next, the $SiO_2$ layer 147 is to be flattened and a part of the $TiO_2$ layer 142 is to be exposed by polishing the $SiO_2$ layer 147 using the CMP method to the top surface level of the $TiO_2$ layer 142 and of the SiN layer 146, as shown in FIG. 16E. Here, the flattening method is not limited to the CMP method, and it may be also available to use any proper flattening technology including such as the spin-on method, the spin-on method combined with the etch back method, or the like.

Next, a material layer 141 to be the upper electrode wiring is to be formed over the surface thereof. According to the present embodiment, the TiN layer of 20 nm thickness, the Al—Cu layer of 200 nm thickness, the Ti layer of 5 nm thickness, and the other TiN layer of 100 nm thickness are to be deposited in order using the spattering method respectively, as the multilayer structure of TiN/Ti/Al—Cu/TiN. Next, the upper electrode wiring 141 is to be formed by etching the material layer 141 to be the upper electrode wiring using the photolithography method with the resist as the mask (not shown) patterned as the line and space (L/S) shape shown as the upper electrode wiring TE in FIG. 2. Moreover, an interlayer insulating layer 148 is to be deposited thereunto, and then the contact (not shown) and the metal wiring (not shown) are to be formed for the upper electrode wiring 141 and the lower electrode wiring 143 respectively, as shown in FIG. 16F.

According to the configuration regarding the present embodiment, there is provided the configuration that the variable resistor body is to be as outstanding shape from the lower electrode wiring toward the upper electrode wiring, and the variable resistor body of bump shape is electrically connected to the lower electrode wiring at the sidewall thereof. Regarding such the variable resistive element formed thereby, it becomes able to reduce the area of the contact surface between the variable resistor body and any of the electrodes comparing to that of the conventional configurations, as well as the above mentioned each of the embodiments.

Figure 17A:
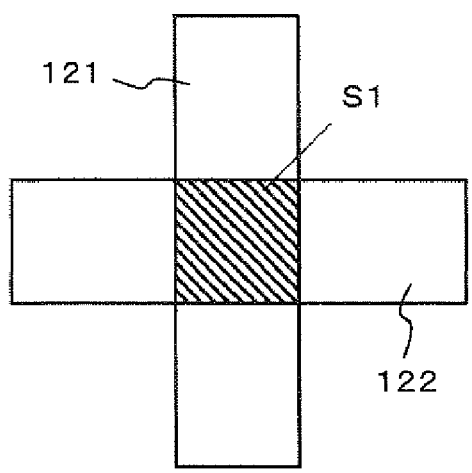
FIG. 17 is a plane pattern diagram showing electrically contributing regions in variable resistor bodies according to a conventional configuration and the fourth embodiment of the present invention, respectively.
Figure 17B:
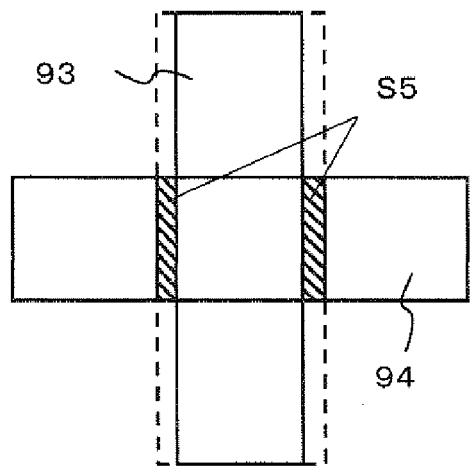

FIG. 17 is a plane pattern diagram of the variable resistive element according to the present embodiment comparing to a variable resistive element of a conventional configuration. FIG. 17A shows the one of the conventional configuration, and FIG. 17B shows regarding the configuration according to the present embodiment. Here, the configuration as shown in FIG. 17A is similar to that shown in FIG. 13A.

According to the variable resistive element regarding the present embodiment, there is provided the configuration that the variable resistor body of bump shape is to be formed only at the region outside a lower electrode wiring 93 (two narrow band regions surrounded by dashed lines in the figure) and to be electrically connected to a lower electrode wiring 93. And then the cross point region as a region S5 (a shaded area in the figure) at the intersection of such the variable resistor body and the upper electrode wiring 94 becomes to be the electrically contributing region in the variable resistor body.

The region S5 has the band shape with the width of at least the layer thickness of the variable resistor body of bump shape, and it is able to reduce the area comparing to the region S1 regarding the conventional variable resistive element. Moreover, it is able to form the variable resistor body of bump shape using the self-aligned process, and then it is able to change arbitrarily such the area by controlling the layer thickness thereof.

That is to say, it is able to reduce the contact area according to the configuration regarding the present embodiment comparing to the contact area of the conventional configuration, as well as the configuration of the above mentioned each of the embodiments. Thus, it becomes able to reduce the current consumption, and it becomes possible to manufacture the memory element reproducibly with the stable switching operation without becoming the programming impossible, by configuring the nonvolatile memory device using such the variable resistive element.

The Fifth Embodiment

The fifth embodiment according to the present invention element and the present invention method (properly referred to as the present embodiment hereinafter) will be described in detail below with reference to FIG. 18 and FIG. 19.

Regarding the above description according to the above mentioned third and the fourth embodiments, there is described as one example for the case of applying to the memory cell of 1R type, however, the present invention is not limited thereto. Regarding the present embodiment, a variable resistive element and it's manufacturing method in the case of being applied to a memory cell of 1T/1R type will be described in detail below as another example.

FIG. 18 is a view showing manufacturing processes for the present invention element according to the present embodiment, as shown by FIG. 18A to FIG. 18G in order of each manufacturing process.

Figure 18A:
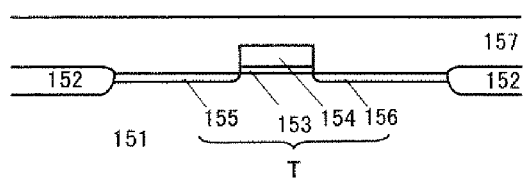
FIG. 18 is a brief cross sectional view showing a variable resistive element according to the fifth embodiment of the present invention in order of manufacturing process.

First, a selective transistor (T) is to be formed on a semiconductor substrate 151 in accordance with the following heretofore known processes, as shown in FIG. 18A. That is to say, the selective transistor (T) is to be formed on the semiconductor substrate 151 on which an element isolation region 152 is formed, which is comprised of a gate insulating layer 153, a gate electrode 154, a drain region 155 and a source region 156 as diffusion layers, and then a base interlayer insulating layer 157 is to be formed thereunto. According to the present embodiment, after depositing the base interlayer insulating layer of BPSG 157 with the thickness of 1200 nm, the surface of the layer is to be flattened by polishing the surface of the BPSG layer 157 using the so-called CMP method to be the thickness of 400 nm on the gate electrode 154.

Figure 18B:
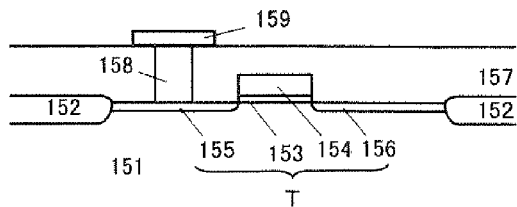

Next, a contact plug 158 is to be formed for connecting between a lower electrode 159 and the drain region 155, as shown in FIG. 18B. Such the contact plug 158 is to be formed in accordance with the following processes of; etching the base interlayer insulating layer 157 with the resist as the mask patterned using the heretofore known photolithography method; opening a part to be a contact hole 158 reaching the drain region 55 in the selective transistor (T); depositing an electrically conductive polysilicon layer thereunto; removing completely the electrically conductive polysilicon layer on the base interlayer insulating layer 157 by polishing using the CMP method; and remaining the electrically conductive polysilicon layer only inside the contact hole 158. Moreover, the lower electrode 159 is to be formed by depositing a TiN layer using the spattering method to be the thickness of 150 nm, and by processing the TiN layer with the resist as the mask patterned using the photolithography method.

Figure 18C:
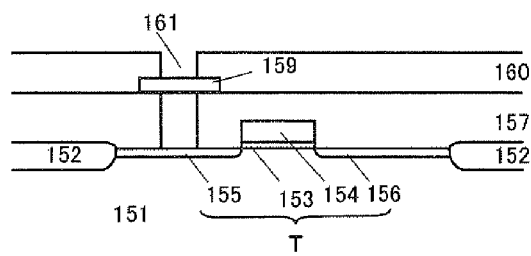

Next, an $SiO_2$ layer 160 is to be deposited using the CVD method with the thickness of 600 nm over the surface thereof, and then the $SiO_2$ layer 160 is to be flattened by polishing the $SiO_2$ layer 160 to be the thickness of 200 nm on the lower electrode 159. Here, the flattening method is not limited to the CMP method, as it may be available to use any proper flattening technology including such as the spin-on method, the spin-on method combined with the etch back method, or the like. And then an open part 161 reaching the lower electrode 159 is to be formed as shown in FIG. 18C thereafter, by patterning the $SiO_2$ layer 160 using the photolithography method and the etching method.

Figure 18D:
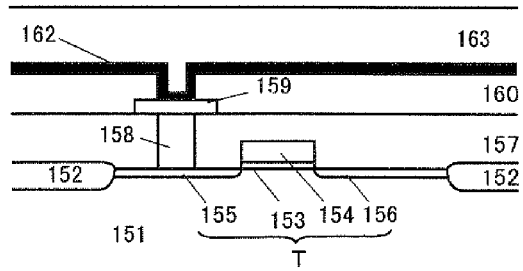

Next, a $TiO_2$ layer 162 as one example of a material layer to be the variable resistor body is to be deposited using the CVD method with the thickness of 25 nm over the surface thereof as shown in FIG. 18D. In this case, it is able to form the $TiO_2$ layer 162 along a sidewall of the open part 161 with the thickness of approximately 20 nm for example. And then an $SiO_2$ layer 163 is to be deposited using the CVD method with the thickness of 600 nm over the surface thereof.

Figure 18E:
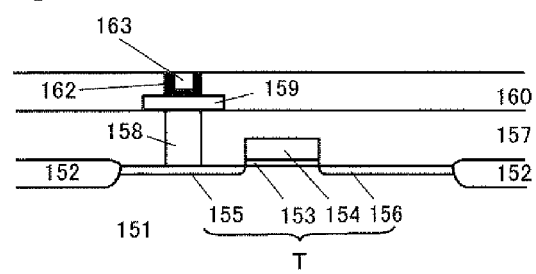

Next, the $SiO_2$ layer 163 is to be flattened and the top surface of the $TiO_2$ layer 162 is to be exposed by polishing the $SiO_2$ layer 163 using the CMP method to the top surface level of the $TiO_2$ layer 162. And then a variable resistor body 162 comprised of the $TiO_2$ layer is to be formed by removing the $TiO_2$ layer 162 on the $SiO_2$ layer 160 except that inside the open part 161 using the etch back method thereafter, as shown in FIG. 18E.

Figure 18F:
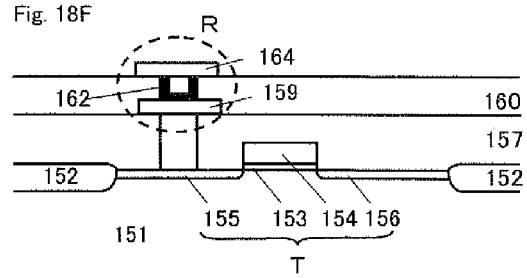

Next, a TiN layer 164 as one example of the material layer to be the upper electrode wiring is to be deposited over the surface thereof. According to the present embodiment, the TiN layer is to be deposited using the spattering method with the thickness of 1.50 nm. And then as shown in FIG. 18F, the upper electrode 164 comprised of the TiN layer is to be processed by patterning using the photolithography method and the etching method, and thus a variable resistive element (R) is formed, which is comprised of the upper electrode 164, the variable resistor body 162 and the lower electrode 159.

Figure 18G:
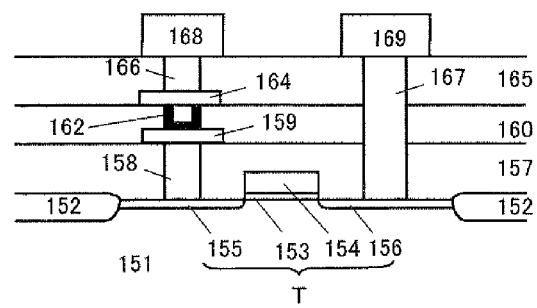

Next, an SiO₂ layer 165 as an interlayer insulating layer on the variable resistive element (R) is to be deposited using the CVD method thereunto. And then as shown in FIG. 18G, a bit wiring 168 for electrically connecting to the upper electrode 164 via a contact plug 166, and a source wiring 169 for electrically connecting to the source region 156 via a contact plug 167 are formed thereunto.

Regarding such the variable resistive element formed thereby, it becomes able to reduce the area of the contact surface between the variable resistor body and any of the electrodes comparing to that of the conventional configurations. The following is a detailed description in this regard with reference to the drawings.

Figure 19A:
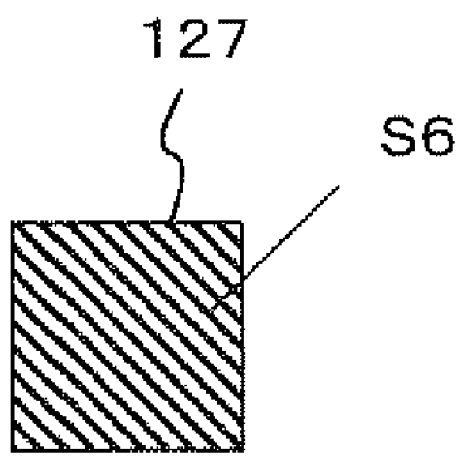
FIG. 19 is a plane pattern diagram showing electrically contributing regions in variable resistor bodies according to a conventional configuration and the fifth embodiment of the present invention, respectively.
Figure 19B:
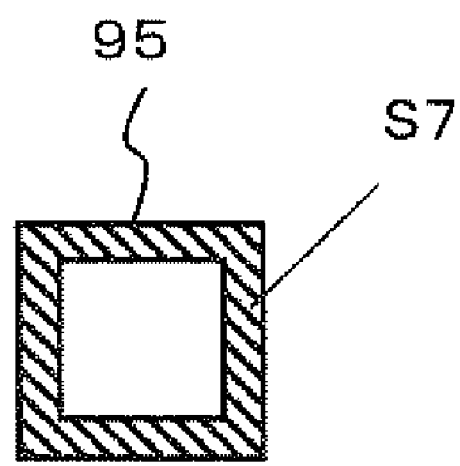

FIG. 19 is a plane pattern diagram of the variable resistive element according to the present embodiment comparing to a variable resistive element of a conventional configuration, in the case of using the memory cell of 1T/1R type. FIG. 19A shows the one of the conventional configuration, and FIG. 19B shows regarding the configuration according to the present embodiment.

Figure 27:
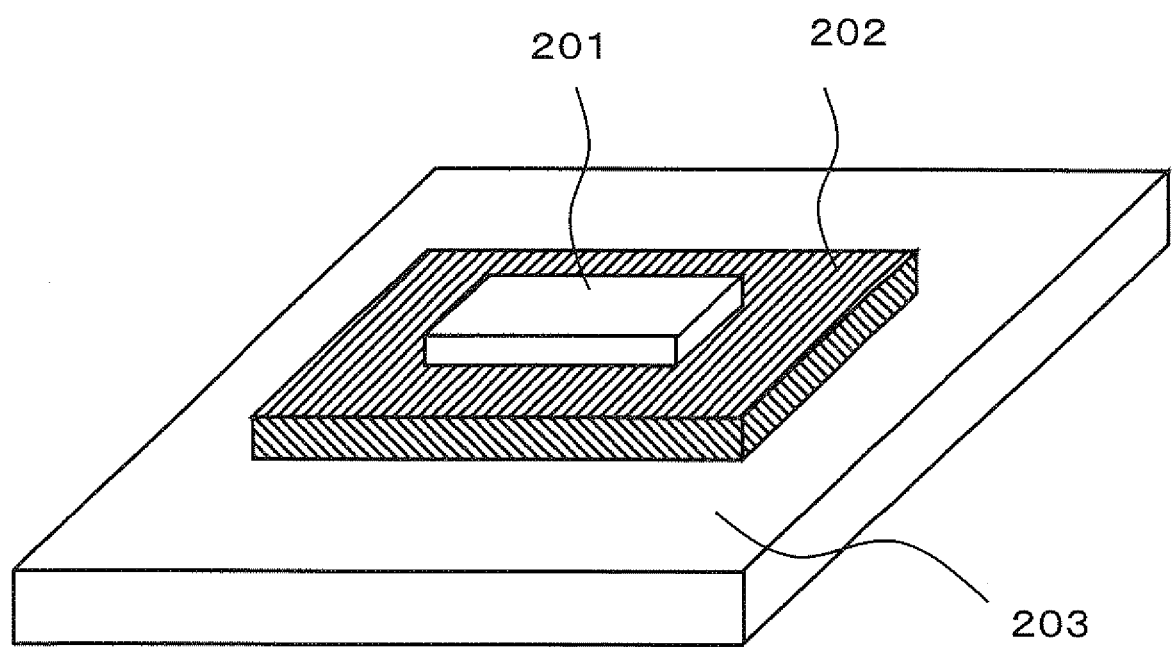
FIG. 27 is a diagrammatic perspective view showing a basic structure of a conventional variable resistive element.
Figure 28:
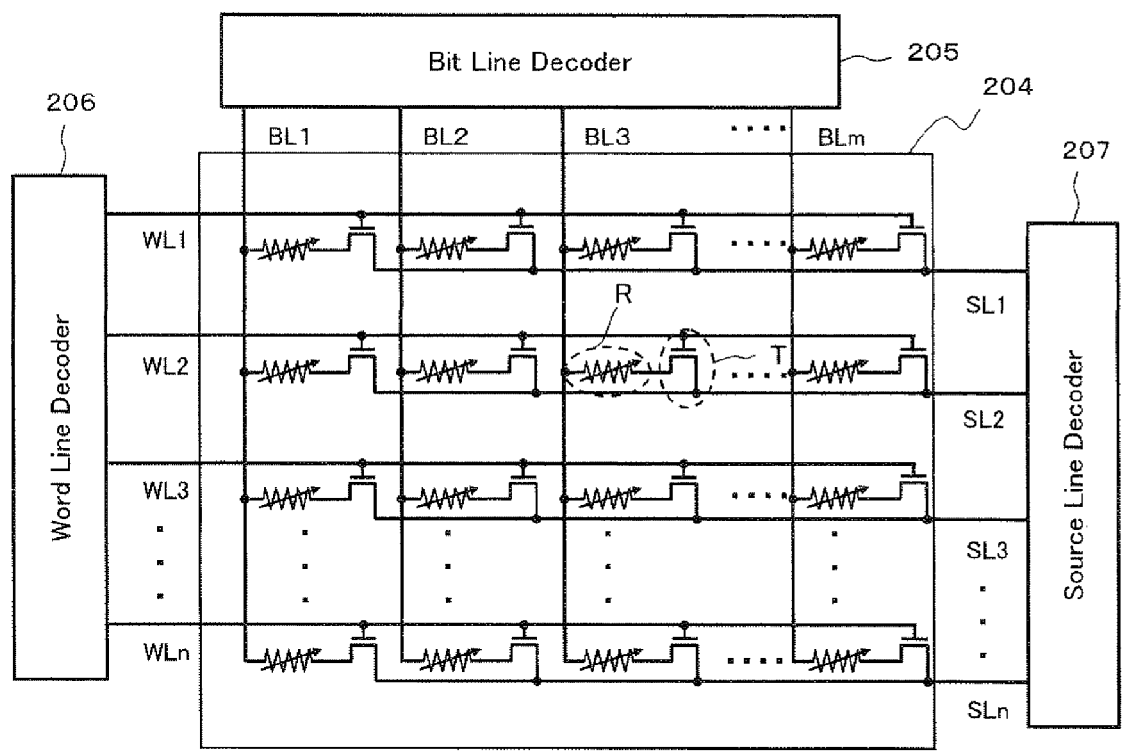
FIG. 28 is a circuit diagram schematically showing one configuration example of a memory cell array using memory cells of 1T/1R type comprising one selective transistor and one variable resistive element.
Figure 29:
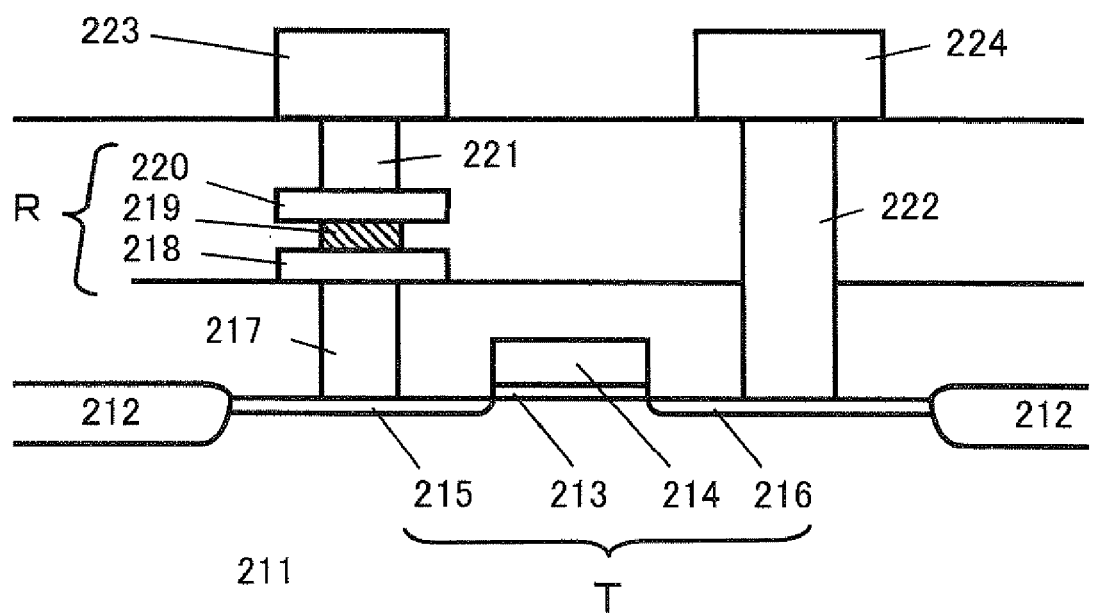
FIG. 29 is a cross sectional pattern diagram showing one configuration example of a conventional memory cell structure of 1T/1R type.
Figure 30:
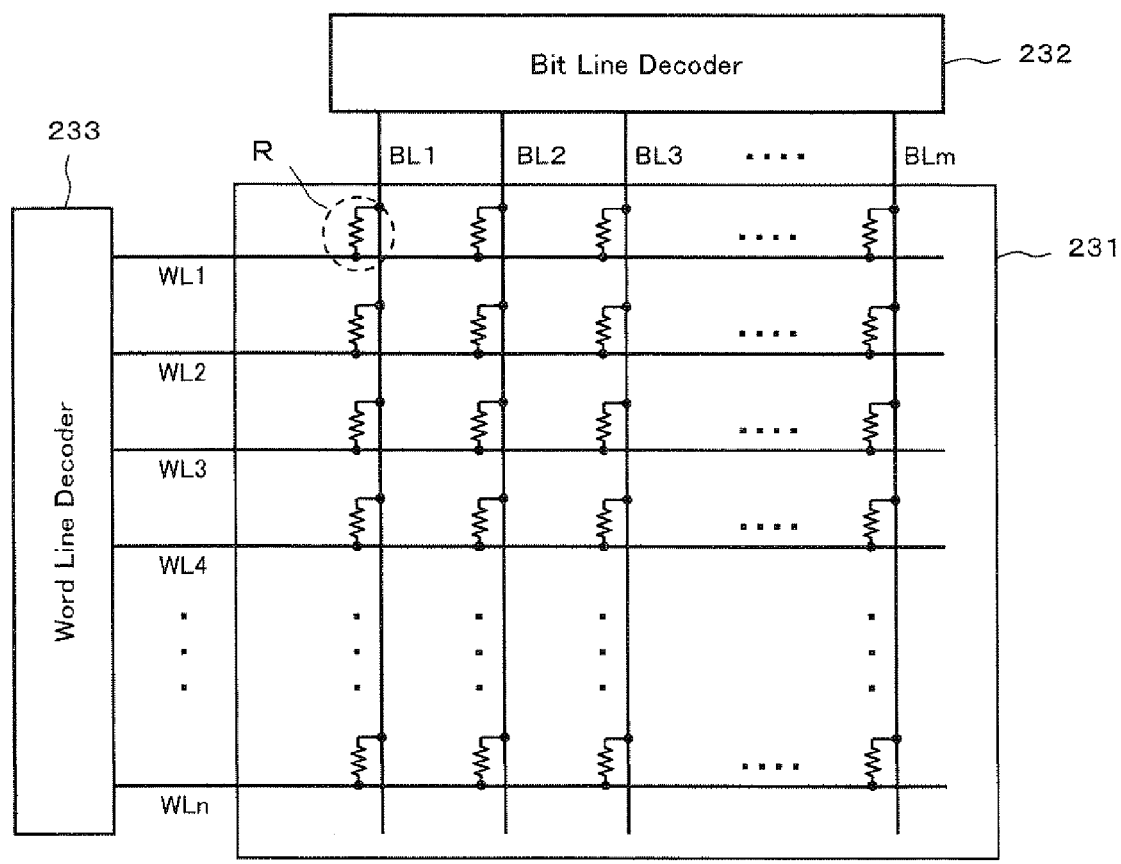
FIG. 30 is a circuit diagram schematically showing one configuration example of a memory cell array using memory cells of 1R type comprising one variable resistive element.
Figure 31:
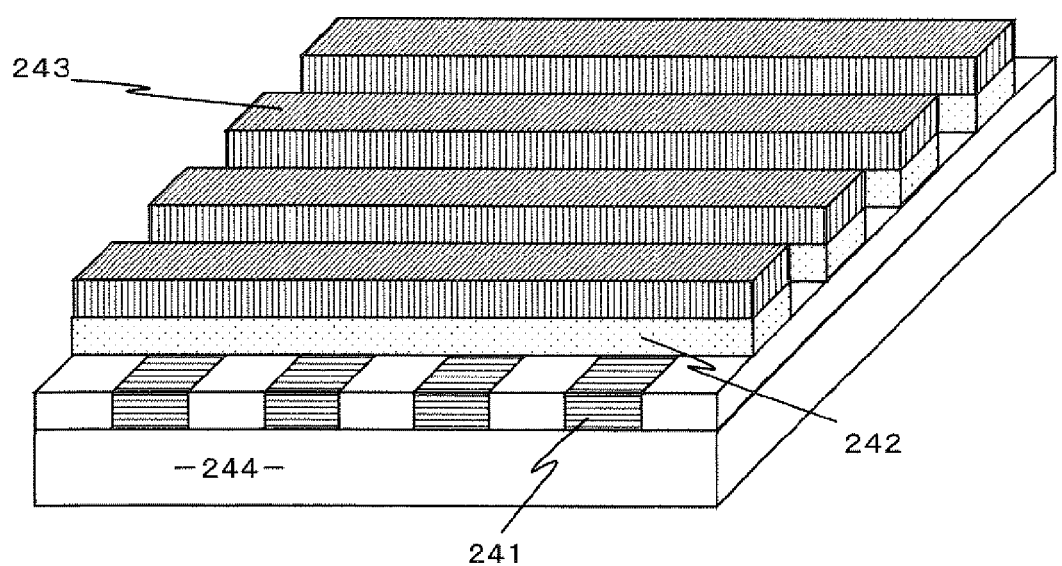
FIG. 31 is a diagrammatic perspective view schematically showing one configuration example of a conventional memory cell structure of 1R type.

In the case of the conventional configuration, the area of the region electrically contributing in the variable resistor body corresponds to the area of either one electrode of the upper electrode or the lower electrode regarding the structure shown in FIG. 27 for example, and corresponds to the area of the open part formed between the upper and the lower electrodes regarding the structure shown in FIG. 29. That is to say, a region of an open part 127 specified by the work dimension is almost coincident with a region S6 (a shaded area in the figure) which is electrically contributing in the variable resistor body, as shown in FIG. 19A.

On the contrary, according to the variable resistive element regarding the present embodiment, a region S7 (a shaded area in the figure) becomes to be the region electrically contributing in the variable resistor body, as an overlapped part between the variable resistor body at the bump part and the upper electrode or the lower electrode, because the variable resistor body is to be formed, which comprises such the bump part as outstanding along the inside region of the open part 95 shown in FIG. 19B. Moreover, the region S7 has a square annular shape with the width as at least the thickness of the variable resistor body at the bump shape part, and it is able to reduce the area comparing to the S6 according to the conventional variable resistive element. Moreover, it is able to form the variable resistor body at the bump shape part using the self-aligned process, and then it is able to change arbitrarily such the area by controlling the layer thickness thereof. Furthermore, it is also able to obtain the similar effect even if the planar shape of the bump shape part in the variable resistor body is a rectangular annular shape, a round annular shape, or the like, based on the shape of the open part.

According to the present embodiment, the above mentioned method is described as forming the variable resistor body to be comprised of the outstanding part inside the open part, however, it may be also available to form the variable resistor body 162 only inner sidewall of the open part 161 using the configuration as well as that of the third embodiment as shown in FIG. 10B. Moreover, it may be also able to comprise a configuration as another modified example that the variable resistor body is to be formed as the outstanding shape at the sidewall of the lower electrode 164 by performing the processes as well as that of the fourth embodiment.

The Sixth Embodiment

The sixth embodiment according to the present invention element and the present invention method (properly referred to as the present embodiment hereinafter) will be described in detail below with reference to FIG. 20 to FIG. 25.

Figure 20A:
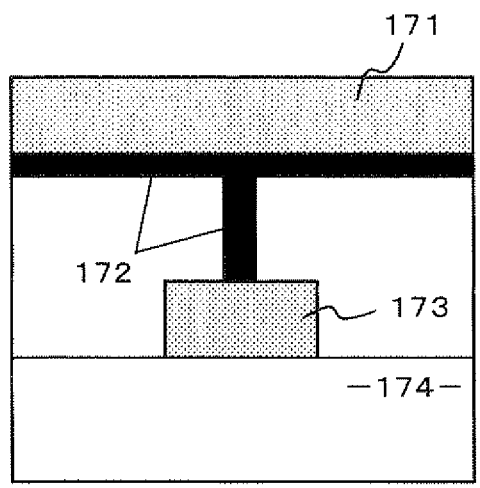
FIG. 20 is a brief cross sectional view showing a configuration of a variable resistive element according to the sixth embodiment of the present invention.

FIG. 20 is a brief cross sectional view showing the present invention element according to the present embodiment. The present invention element according to the present embodiment comprises a configuration that a lower electrode wiring 173 and an upper electrode wiring 171 are formed on a base substrate 174, and a variable resistor body 172 as the memory material body is formed between the upper and the lower electrode wirings, wherein the variable resistor body 172 electrically connected to the upper electrode wiring 171 is formed to be as outstanding shape toward the lower electrode wiring 173, as shown in FIG. 20A. Hence, the cross-sectional shape at the contact surface between the variable resistor body 172 and the Tower electrode wiring 173 is formed so as to be narrower than the line width of the lower electrode wiring 173 thereby.

Figure 20B:
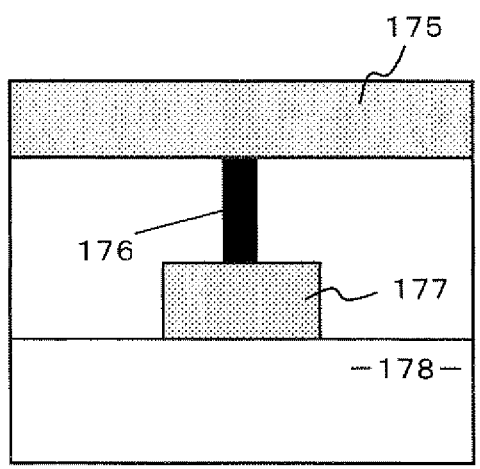

Moreover, the other present invention element according to the present embodiment comprises a configuration that a lower electrode wiring 177 and an upper electrode wiring 175 are formed on a base substrate 178, and a variable resistor body 176 as the memory material body is formed between the upper and the lower electrode wirings, wherein the variable resistor body 176 is to be formed only at a partial region on the lower electrode wiring 177, as shown in FIG. 20B. Hence, every cross-sectional shape is formed so as to be narrower than the line width of the lower electrode wiring 177 thereby, at each of the contact surfaces between the variable resistor body 176 and the upper electrode wiring 175, and between the variable resistor body 176 and the lower electrode wiring 177 respectively.

The following is a description as an example for the case of applying the present invention element comprised of such the configuration to a memory cell of 1R type, using the variable resistive element shown in FIG. 20A. FIG. 21 to FIG. 23 are views showing manufacturing processes for the present invention element according to the present embodiment, as shown by FIG. 21A to FIG. 23I in order of each manufacturing process (Those are separated into three views for convenience' sake due to page space). In FIG. 21 to FIG. 23, a cross sectional pattern diagram along the X-X' dashed line, that is to say, along the upper electrode wiring TE in FIG. 2 showing the memory cell array of the 1R configuration, and a cross sectional pattern diagram along the Y-Y' dashed line therein, that is to say, along the lower electrode wiring BE are shown at the left side and the right side respectively therein. Moreover, FIG. 24 is a plane pattern diagram showing a pattern layout of an open part pattern WBE used in a manufacturing process as shown in FIG. 21C.

First, a base insulating layer 184 is to be formed on a semiconductor substrate 185 that peripheral circuits and the like (not shown) are properly formed. According to the present embodiment as well as the third embodiment, after depositing the base insulating layer of BPSG 184 with the thickness of 1500 nm, the surface of the layer is flattened by polishing the surface of the BPSG layer 184 using the CMP method to be the thickness of 800 nm on the top surface of the semiconductor substrate 185. Next, a material layer 183 to be a lower electrode wiring is to be deposited thereon. According to the present embodiment, the Ti layer of 5 nm thickness, the TiN layer of 20 nm thickness, the Al—Cu layer of 200 nm thickness, the other Ti layer of 5 nm thickness, and the other TiN layer of 105 nm thickness are to be deposited in order using the spattering method respectively, as the multilayer structure of TiN/Ti/Al—Cu/TiN/Ti. Next, the lower electrode wiring 183 is to be formed as shown in FIG. 21A, by etching the material layer 183 to be the lower electrode wiring using the photolithography method with the resist as the mask (not shown) patterned as the line and space (L/S) shape shown as the lower electrode wiring BE in FIG. 2. Moreover, an SiO$_2$ layer 186 is to be deposited using the CVD method with the thickness of 600 nm over the surface thereof.

Next, such the surface is to be flattened by polishing the SiO$_2$ layer 186 using the CMP method to the top surface level of the lower electrode wiring 183. Moreover, an Al$_2$O$_3$ layer 187 is to be deposited using the CVD method with the thickness of 150 nm over the surface thereof, as shown in FIG. 21B.

Figure 24:
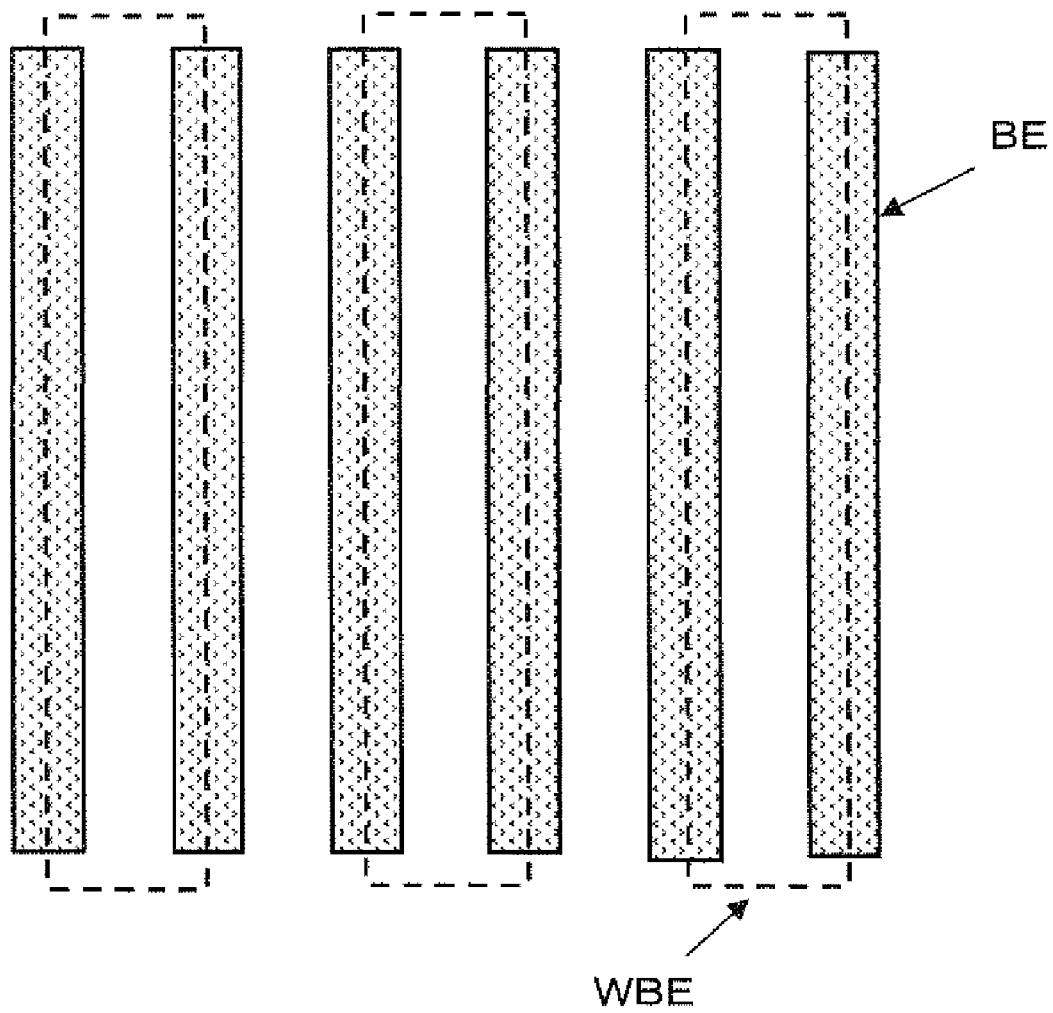
FIG. 24 is a plane pattern diagram showing a pattern layout of open parts regarding manufacturing processes of the variable resistive element according to the sixth embodiment of the present invention.

Next, an open part 188 is to be formed for between the adjacent pattern of the Al$_2$O$_3$ layer 187 as shown in FIG. 21C, by etching the Al$_2$O$_3$ layer 187 using the photolithography method with the resist as the mask (not shown in FIG. 21) patterned with an open part of pattern shape shown as a region WBE surrounded by a dashed line in FIG. 24. In FIG. 24, a BE pattern is the configuration as similar to that of the lower electrode wiring BE as shown in FIG. 2, and the open part pattern WBE is the pattern to be extended toward the similar direction of the lower electrode wiring BE, wherein both sides at the short side are to be arranged inside the region of any adjacent two of the lower electrode wirings BE respectively. Moreover, the open part pattern WBE is arranged iteratively, with a pitch of every two of the lower electrode wirings BE, and in parallel to the lower electrode wiring BE. Here, the both sides at the short side (interfaces at the short side) of the open part pattern WBE are not required to be on central lines of the lower electrode wirings BE respectively, and it may exist anywhere at least inside the regions of the lower electrode wirings BE.

Next, an SiO$_2$ layer 189 as an insulating material is to be deposited using the CV) method with the thickness of 25 nm over the surface thereof, as shown in FIG. 21D. And then it is able to form the SiO$_2$ layer 189 along the inner sidewall of the open part 188 with the thickness of 20 nm for example. Here, such the SiO$_2$ layer 189 is to be formed along the open part 188, so that the inside of the open part 188 may be not to be filled therewith.

Next, a process using the etch back method is performed for the SiO$_2$ layer 189 to be removed completely from both surfaces of the insulating layers 186 and 187. Hence, the SiO$_2$ layer 189 is to be remained only at the sidewall of the open part 188 by such the process, as shown in FIG. 22E. Moreover, an SiN layer 190 is to be deposited using the CVD method with the thickness of 600 nm over the surface thereof.

Next, the SiN layer 190 is to be flattened and an apical part of the SiO$_2$ layer 189 formed at the inner sidewall of the open part 188 is to be exposed by polishing the SiN layer 190 using the CMP method to the top surface level of the Al$_2$O$_3$ layer 87, as shown in FIG. 22F. And then as a result of such the process, the insulating layers 187 and 190 are to be alternately arranged sandwiching the SiO$_2$ layer 189 therebetween, as shown in FIG. 22F as well.

Next, only the SiO$_2$ layer 189 is to be removed selectively for the Al$_2$O$_3$ layer 187, the SiN layer 190 and the lower electrode wiring 183, using the wet etching method with a hydrofluoric acid, as shown in FIG. 22G. According to such the process, only a partial region on the top surface of the lower electrode wiring 183 is to be exposed with the thickness of the SiO$_2$ layer 189 formed along the inner sidewall of the open part 188, and then an open part 191 is to be formed with a height of the thickness of the Al$_2$O$_3$ layer 187 or that of the SiN layer 190.

Next, a TiO$_2$ layer 182 as one example of the material layer for variable resistor body is to be deposited over the surface thereof, as shown in FIG. 22H. According to the present embodiment, the CVD method is used for depositing the TiO$_2$ layer by reacting TiCl$_4$ with oxygen at the substrate temperature of between 350 and 400° C. According to such the process, the TiO$_2$ layer 182 to be the variable resistor body is implanted into the open part 191 inside formed at the part of the top surface of the lower electrode wiring 183.

Next, a material layer 181 to be the upper electrode wiring is to be formed over the surface thereof. According to the present embodiment, the TiN layer of 20 nm thickness, the Al—Cu layer of 200 nm thickness, the Ti layer of 5 nm thickness, and the other TiN layer of 100 nm thickness are to be deposited in order using the spattering method respectively, as the multilayer structure of TiN/Ti/Al—Cu/TiN. Next, the upper electrode wiring 181 is to be formed by etching the material layer 81 to be the upper electrode wiring using the photolithography method with the resist as the mask (not shown) patterned as the line and Space (L/S) shape shown as the upper electrode wiring TE in FIG. 2. Moreover, an interlayer insulating layer 192 is to be deposited thereunto, and then the contact (not shown) and the metal wiring (not shown) are to be formed for the upper electrode wiring 181 and the lower electrode wiring 183 respectively, as shown in FIG. 23I.

The above description regarding the manufacturing processes is embodied for an application of the variable resistive element shown in the FIG. 20A. Meanwhile, the variable resistive element shown in the FIG. 20B can be formed with the process shown in FIG. 22H including the steps of; depositing the TiO$_2$ layer 182 first over the surface thereof performing a process using the etch back method to remove the TiO$_2$ layer 182 completely from both surfaces of the Al$_2$O$_3$ layer 187 and the SiN layer 190; and remaining the TiO$_2$ layer 182 only at the inside of the open part 191. In this case, a tip of the TiO$_2$ layer 182 is formed to be as approximately same as the level surface of the Al$_2$O$_3$ layer 187 and that of the SiN layer 190 according to the present embodiment. However, the present invention is not limited thereto, and it may also comprise a configuration that such the variable resistor body is to be formed with the thickness thinner by performing further etching for the TiO$_2$ layer 182 and by forming the tip of the TiO$_2$ layer 182 to be lower than the level surface of the Al$_2$O$_3$ layer 187 and that of the SiN layer 190, as an object of adjusting the thickness of the variable resistor body in the direction of facing between the upper and the lower electrode wiring.

Regarding such the variable resistive elements shown in FIG. 20A and FIG. 20B that are formed thereby, it becomes able to reduce the area of the contact surface between the variable resistor body and any of the electrodes comparing to that of the conventional configurations. The following is a detailed description in this regard with reference to the drawings.

Figure 25A:
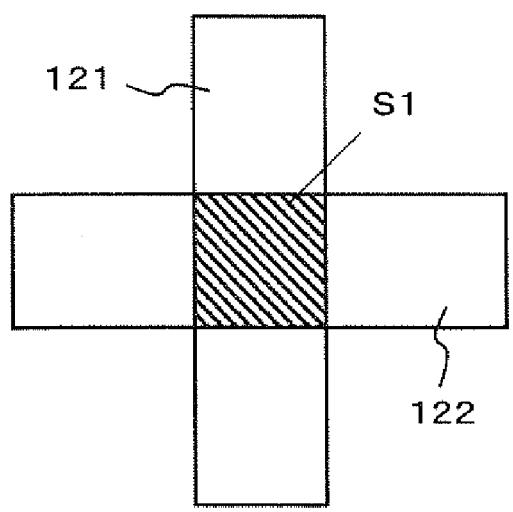
FIG. 25 is a plane pattern diagram showing electrically contributing regions in variable resistor bodies according to a conventional configuration and the sixth embodiment of the present invention, respectively.
Figure 25B:
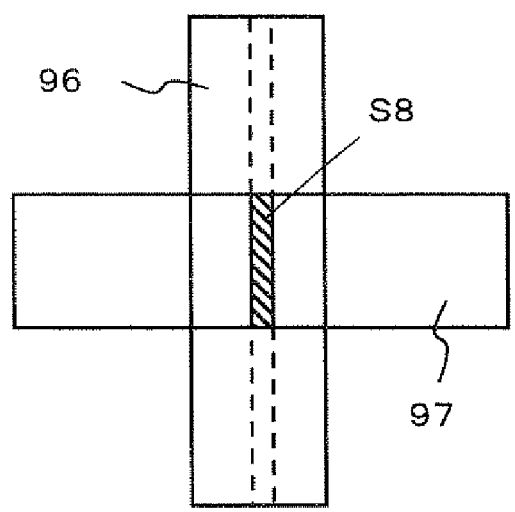

FIG. 25 is a plane pattern diagram of the variable resistive element according to the present embodiment comparing to a variable resistive element of a conventional configuration. FIG. 25A shows the one of the conventional configuration, and FIG. 25B shows the configuration according to the present embodiment. Here, the configuration as shown in FIG. 25A is similar to that shown in FIG. 13A and FIG. 17A.

According to the variable resistive element regarding the present embodiment, there is provided the configuration that the variable resistor body is to be formed only at a partial region of an interface side for the open part pattern WBE as sown in FIG. 24 on a lower electrode wiring 96 (a narrow band region surrounded by dashed lines in FIG. 25) for electrically connecting to such the lower electrode wiring. And then the cross point region as a region S8 (the shaded area in the figure) at the intersection of such the variable resistor body and an upper electrode wiring 97 becomes to be the electrically contributing region in the variable resistor body.

The region S8 has a band shape with the width of at least the layer thickness of the variable resistor body formed at the partial region on the lower electrode wiring 96, and it is able to reduce the area comparing to the region S1 regarding the conventional variable resistive element. Moreover, it is able to form such the variable resistor body using the self-aligned process, and then it is able to change arbitrarily such the area.

That is to say, it is able to reduce the contact area according to the configuration regarding the present embodiment comparing to the contact area of the conventional configuration, as well as the configuration of the above mentioned each of the embodiments. Thus, it becomes able to reduce the current consumption, and it becomes possible to manufacture the memory element reproducibly with the stable switching operation without becoming the programming impossible, by configuring the nonvolatile memory device using such the variable resistive element. Moreover, it becomes able to reduce the contract area further than that of the third and the fourth embodiments wherein the contact area is two of the band shape for one variable resistive element, because the contact area according to the present embodiment is only one band shape for one variable resistive element, though the photolithography process and the etching process using the open part pattern WBE are added.

According to the present embodiment, the layer overlying the open part 188 is to be $SiO_2$ layer 189, however, the present invention is not limited thereto; it may be also available to use any other material layers properly, Moreover, such the layer is not required to be the insulating material layer because it is the dummy layer to be removed at the process as shown in FIG. 22G, and it may be an electrically conductive layer as well. However, it is desirable to use a material to be able to be removed by etching selectively for the insulating layers 187 and 190, and the lower electrode wiring 183. Moreover, such the selective etching is to be the wet etching by using the acid treatment according to the present embodiment, however, the present invention is not limited thereto. Furthermore, regarding the insulating layers 186, 187 and 190, the present invention is not limited to such the layer materials according to the present embodiment.

As described using the above mentioned first to the sixth embodiments, it is not necessary to reduce the line width of the upper electrode or of the lower electrode, because the present invention element comprises the configuration that the cross-sectional shape of the current path, in which the current flows through via the variable resistor body to be electrically connected to the upper electrode or the lower electrode, is formed so as to be narrower than any line width of the upper and the lower electrodes, and the line width of the cross-sectional shape of the current path is smaller than the minimum work dimension regarding the manufacturing processes therefor. And then according to the present invention element, it becomes able to avoid from a problem as increasing the wiring resistance of the upper electrode or of the lower electrode that may occur in the case of solving the conventional problems by reducing the line width of the upper electrode or of the lower electrode using some sort of method beyond a limitation of an exposure technology. This indicates that the present invention element is more effective for the memory cell array configuration of 1R type, wherein it is required to comprise an electrode wiring length as further longer corresponding to an integration of more memory cells.

According to the above mentioned each of the embodiments regarding the present invention, the shape is embodied as the width of the variable resistor body formed along the thickness direction of the insulating layer is to be the same approximately. However, the variable resistor body in the variable resistive element according to the present invention is not limited to such the shapes. It may also available to use other modified examples as shown in FIGS. 26A and 26B for example, if it comprises a configuration for reducing the area of the region electrically contributing in the variable resistor body as the characteristics of the present invention element.

Figure 26A:
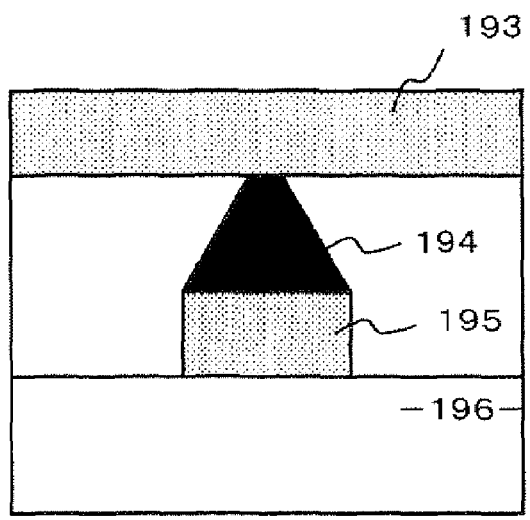
FIG. 26 is a brief cross sectional view showing other modified examples of the present invention.

In FIG. 26A, there is provided a configuration that a lower electrode wiring 195 and an upper electrode wiring 193 are formed on a base substrate 196, and a variable resistor body 194 as a memory material body is formed between the upper and the lower electrode wirings, wherein the variable resistor body 194 electrically connected to the lower electrode 195 is formed to be a shape tapered toward the upper electrode wiring 193. Hence, only the contact area between the variable resistor body 194 and the upper electrode wiring 193 is formed with the shape of narrower than the line width of the lower electrode wiring 195 thereby.

Figure 26B:
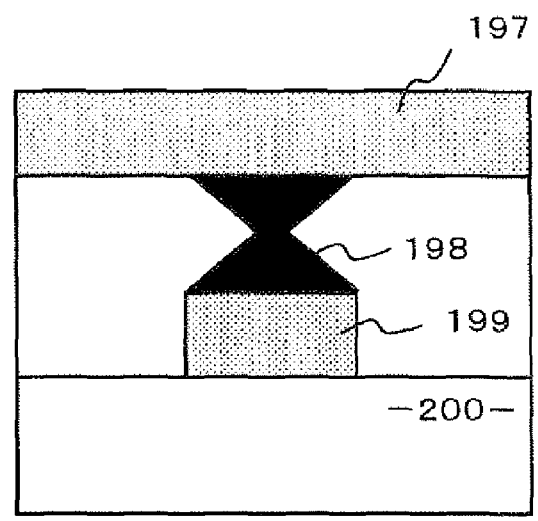

Moreover, in FIG. 26B, there is provided a configuration that a lower electrode wiring 199 and an upper electrode wiring 197 are formed on a base substrate 200, and a variable resistor body 198 as a memory material body is formed between the upper and the lower electrode wirings, wherein a constricted part narrower than the line width of the lower electrode wiring 199 is formed at a part of the variable resistor body 198 electrically connected to the upper and the lower electrode wirings. And then the current path, in which the current flows through between the upper and the lower electrode wirings via the variable resistor body, is constrained at the cross section region of such the constricted part as the part having the minimum cross section in the variable resistor body between the upper and the lower electrode wirings. That is to say, it is not required to reduce the area of the region electrically contributing in the variable resistor body at either face contacting to the upper or the lower electrode wiring, and then it may be available to reduce the area of the planer shape regarding at least a part of the variable resistor body, as the present modified example.

Moreover, according to the above mentioned each of the embodiments regarding the present invention, the variable resistor body is to be the $TiO_2$ layer, however, the variable resistor body layer is not limited thereto. For example, it is able to use an oxide of other transition metal elements or an oxynitride of other transition metal elements therefor. Or, even in the case of applying a perovskite-type oxide of such as the PCMO layer or the like to the variable resistor body, an effectiveness of the present invention is not negatively influenced thereby. Moreover, according to the above mentioned each of the embodiments, the $TiO_2$ layer formed using the CVD method is to be used for the variable resistor body, however, the layer formation method is not limited thereto. For example, in the case of using any of other proper layer formation methods such as the spattering method, an evaporation method, a spin coat method, or the like, using any of other proper material layers, the effectiveness of the present invention is not negatively influenced thereby.

Moreover, according to the above mentioned each of the embodiments regarding the present invention, the upper electrode and the lower electrode are to be the TiN layer, or the layer of multilayer structure comprised of the TiN layer, Ti layer and the Al—Cu layer, however, the present invention is not limited thereto. For example, it is able to select arbitrarily from other transition metals, an alloy of such the transition metal elements, a rare metal of such as Pt, Ir, Ru, Os, Rh, Pd, or the like, a metal element of such as Al or the like, or other sort of alloys.

Moreover, according to the above mentioned each of the embodiments regarding the present invention, there is described such as the titanium nitride is to be the TiN, the titanium oxide is to be the $TiO_2$, or the like, however, such the description is an abbreviation, and thus a composition ratio for each of the elements is not exactly defined thereby. In particular, there is no prevention for the titanium oxide as a variable resistor body from applying to the present invention, if the titanium oxide comprises a composition ratio for a variable resistance property. Furthermore, the described dimensions is one example for describing the manufacturing processes according to the above mentioned each of the embodiments, and thus the present invention is not limited to such the dimensions.

INDUSTRIAL APPLICABILITY

The variable resistive element and it's manufacturing method according to the present invention are applicable to a nonvolatile semiconductor memory device.

The invention claimed is:

1. A variable resistive element comprising;
   a lower electrode;
   an upper electrode;
   two insulating layers being separated by a gap and opposite each other in a direction parallel to a substrate, the two insulating layers providing electrical insulation between the lower electrode and the upper electrode; and
   a variable resistor body provided between the lower electrode and the upper electrode, the variable resistor body extending along the gap sandwiched by the two insulating layers to connect the two electrodes in a direction perpendicular to the substrate, wherein
   an electrical resistance of between the lower electrode and the upper electrode is changed by applying a voltage pulse to between the two electrodes, and
   a spacing between the two insulating layers is smaller than a minimum work dimension regarding manufacturing processes.

2. The variable resistive element according to claim 1, wherein
   a cross-sectional shape of the variable resistor body in a plane parallel to the substrate has an annular or linear shape.

3. The variable resistive element according to claim 2 further comprising:
   an open part to expose whole or a part of a top surface of the lower electrode, wherein
   the variable resistor body is formed along an inner sidewall of the open part or filling inside the open part.

4. A manufacturing method of a variable resistive element, the variable resistive element according to claim 3, the method comprising:
   a first step of forming the lower electrode by depositing any of electrode materials onto a substrate to be a first electrode layer;
   a second step of forming a first insulating layer on the lower electrode, the first insulating layer having an open part reaching a top surface of the lower electrode;
   a third step of forming the variable resistor body along an inner sidewall of the open part formed at the second step or filling an inside of the open part with the variable resistor body; and
   a fourth step of forming the upper electrode by depositing any of electrode materials to be a second electrode layer.

5. The manufacturing method according to claim 4, wherein the third step includes steps of:
   depositing a material layer for variable resistor body onto the open part and the first insulating layer;
   depositing a second insulating layer onto the material layer for variable resistor body;
   removing the second insulating layer to expose a top surface of the material layer for variable resistor body; and
   forming the variable resistor body inside the open part by removing the material layer for variable resistor body layered on a region other than an upper region of the open part.

6. The manufacturing method according to claim 4, wherein
   the second step includes a step of forming the first insulating layer having the open part reaching at least a part of the top surface of the lower electrode and comprised of a third insulating layer and a fourth insulating layer, the third insulating layer and the fourth insulating layer extending in a direction parallel to the lower electrode, being arranged alternately and continuously, and sandwiching the open part therebetween, the step includes steps of:
   depositing the third insulating layer on a plurality of lower electrodes;
   forming preliminary open parts inside the third insulating layer, the preliminary open parts crossing upper regions of any adjacent pair of the lower electrodes and passing completely through the third insulating layer for reaching at least a part of the top surface of both of the adjacent pair of the lower electrodes;
   depositing a dummy layer inside the preliminary open parts and on the third insulating layer using any of materials different from that for the third insulating layer;
   forming a dummy sidewall layer comprised of the dummy layer at sidewalls of the preliminary open parts by removing the dummy layer on the third insulating layer;
   depositing the fourth insulating layer on the dummy sidewall layer;
   flattening the fourth insulating layer to expose an apical part of the dummy sidewall layer; and
   forming the open part by removing the dummy sidewall layer.

7. The manufacturing method according to claim 6, wherein
   the second step includes a step of patterning the preliminary open parts in a stripe pattern, and
   the third step is a step of filling the inside of the open part with the variable resistor body.

8. The manufacturing method according to claim 4, wherein
   the third step includes steps of:
   depositing a material layer for variable resistor body onto the open part and the first insulating layer; and forming the variable resistor body along an inner sidewall of the open part or filling the variable resistor body inside the open part by removing the material layer for variable resistor body layered on the first insulating layer.

9. The manufacturing method according to claim 4, wherein
   the second step includes a step of patterning the open part in a stripe pattern, and
   the third step includes steps of:
   depositing a material layer for variable resistor body onto the open part and the first insulating layer; and removing the material layer for variable resistor body layered on the first insulating layer to form the variable resistor body along an inner sidewall of the open part.

10. The variable resistive element according to claim 2, wherein
the variable resistor body is formed along an outer sidewall of one of the two insulating layers on the lower electrode.

11. A manufacturing method of a variable resistive element, the variable resistive element according to claim 10, the method comprising:
a first step of forming the lower electrode by depositing a first electrode layer for constituting the lower electrode and a first insulating layer on a substrate and by processing the first electrode layer and the first insulating layer;
a second step of forming the variable resistor body along an outer sidewall of the lower electrode and along an outer sidewall of the first insulating layer; and
a third step of forming the upper electrode by depositing any of electrode materials to be a second electrode layer.

12. The method according to claim 11, wherein the second step includes steps of:
depositing a material layer for variable resistor body on a whole surface including a top surface of the first insulating layer;
forming the variable resistor body at an outer sidewall of the first electrode layer and at an outer sidewall of the first insulating layer by removing the material layer for variable resistor body formed at a region other than the outer sidewalls of the first electrode layer and the first insulating layer;
depositing a second insulating layer on a whole surface including a top surface of the variable resistor body and of the first insulating layer; and flattening the second insulating layer to expose the top surface of the variable resistor body.

13. The variable resistive element according to claim 1, wherein
the lower electrode extends in a first direction parallel to a substrate surface,
the upper electrode extends in a second direction that is parallel to the substrate surface and perpendicular to the first direction,
a first interlayer insulating layer that is one of the two insulating layers is divided in the second direction with the lower electrode sandwiched therebetween, and each side surface of the two divided first interlayer insulating layers facing each other is in contact with corresponding side surface of the lower electrode and extends in the first direction,
a second interlayer insulating layer that is the other of the two insulating layers has a bottom surface that is in contact with a top surface of the lower electrode or positioned above a top surface of the lower electrode, and has a top surface that is in contact with a bottom surface of the upper electrode, and extends in the first direction with a line width in the second direction narrower than that of the lower electrode,
the variable resistor body extends in the first direction, and an upper end surface of the variable resistor body is in contact with the bottom surface of the upper electrode at an intersection between the lower electrode and the upper electrode, and a lower end surface of the variable resistor body is in contact with the top surface of the lower electrode, and
a spacing in the second direction between the first interlayer insulating layer and the second interlayer insulating layer is smaller than a minimum work dimension regarding manufacturing processes.

14. The variable resistive element according to claim 1, wherein
the lower electrode extends in a first direction parallel to a substrate surface,
the upper electrode extends in a second direction that is parallel to the substrate surface and perpendicular to the first direction,
a first interlayer insulating layer that is one of the two insulating layers has a bottom surface that is in contact with a top surface of the lower electrode, a top surface that is in contact with a bottom surface of the upper electrode, and two side surfaces each of which forms a vertically continuous side surface with corresponding side surface of the lower electrode and extends in the first direction,
a second interlayer insulating layer that is the other of the two insulating layers is divided in the second direction with the lower electrode sandwiched therebetween, and each of side surfaces of the two divided second interlayer insulating layers is away from the side surface of the lower electrode and extends in the first direction,
the variable resistor body extends in the first direction, and an upper end surface of the variable resistor body is in contact with the bottom surface of the upper electrode at an intersection between the lower electrode and the upper electrode, and a lower end surface of the variable resistor body is in contact with the side surfaces of the lower electrode, and
a spacing in the second direction between the first interlayer insulating layer and the second interlayer insulating layer is smaller than a minimum work dimension regarding manufacturing processes.

15. The variable resistive element according to claim 1, wherein
the lower electrode extends in a first direction parallel to a substrate surface,
the upper electrode extends in a second direction that is parallel to the substrate surface and perpendicular to the first direction,
a first interlayer insulating layer that is one of the two insulating layers has an open part penetrating between a top surface of the lower electrode and a bottom surface of the upper electrode at an intersection between the lower electrode and the upper electrode,
a second interlayer insulating layer that is the other of the two insulating layers is formed inside the open part so that its bottom surface is in contact with a top surface of the lower electrode or positioned above a top surface of the lower electrode, its top surface is in contact with a bottom surface of the upper electrode, and its outer side surface is away from and facing an inner side surface of the open part,
an upper end surface of the variable resistor body is in contact with the bottom surface of the upper electrode, and a lower end surface of the variable resistor body is in contact with the top surface of the lower electrode, and
a spacing between the first interlayer insulating layer and the second interlayer insulating layer is smaller than a minimum work dimension regarding manufacturing processes.

16. The variable resistive element according to claim 1, wherein
the lower electrode extends in a first direction parallel to a substrate surface, the upper electrode extends in a second direction that is parallel to the substrate surface and perpendicular to the first direction, the two insulating layers are separated in the second direction on the lower electrode, each of the two insulating layers has a top surface that is in contact with a bottom surface of the upper electrode or positioned below or above a bottom surface of the upper electrode, and has a bottom surface that is in contact with a top surface of the lower electrode, and each of side surfaces of the two insulating layers facing each other extends in the first direction, the variable resistor body extends in the first direction, and an upper end surface of the variable resistor body is in contact with the bottom surface of the upper electrode at an intersection between the lower electrode and the upper electrode, and a lower end surface of the variable resistor body is in contact with the top surface of the lower electrode, and a spacing in the second direction between the two insulating layers is smaller than a minimum work dimension regarding manufacturing processes.

17. The variable resistive element according to claim 1, wherein the lower electrode extends in a first direction parallel to a substrate surface, the upper electrode extends in a second direction that is parallel to the substrate surface and perpendicular to the first direction, and the variable resistor body with a linear shape is formed at an intersection between the upper electrode and the lower electrode so as to extend in the first direction.

* * * * *